(12) United States Patent
Kim

(10) Patent No.: US 9,614,152 B2
(45) Date of Patent: Apr. 4, 2017

(54) PHASE CHANGE MATERIAL LAYERS

(71) Applicant: Samsung Electronics Co., Ltd., Suwon-Si, Gyeonggi-Do (KR)

(72) Inventor: Dohyung Kim, Seongnam-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 163 days.

(21) Appl. No.: 14/259,594

(22) Filed: Apr. 23, 2014

(65) Prior Publication Data

US 2015/0041747 A1 Feb. 12, 2015

(30) Foreign Application Priority Data

Aug. 6, 2013 (KR) ................. 10-2013-0092857

(51) Int. Cl.
*H01L 45/00* (2006.01)
*H01L 27/24* (2006.01)

(52) U.S. Cl.
CPC ........ *H01L 45/144* (2013.01); *H01L 27/2409* (2013.01); *H01L 27/2463* (2013.01); *H01L 45/06* (2013.01); *H01L 45/124* (2013.01); *H01L 45/126* (2013.01); *H01L 45/1233* (2013.01); *H01L 45/1246* (2013.01); *H01L 45/1616* (2013.01); *H01L 45/1683* (2013.01)

(58) Field of Classification Search
CPC ... H01L 45/144; H01L 45/06; H01L 45/1233; H01L 45/124; H01L 27/2463; H01L 45/126

USPC .......... 257/2, E45.001; 428/457, 64.5, 64.4; 252/503

See application file for complete search history.

(56) References Cited

U.S. PATENT DOCUMENTS

| | | | |
|---|---|---|---|
| 5,534,712 A | 7/1996 | Ovshinsky et al. | |
| 6,040,066 A | 3/2000 | Zhou et al. | |
| 6,607,869 B1 | 8/2003 | Kojima et al. | |
| 7,151,273 B2 | 12/2006 | Campbell et al. | |
| 7,233,054 B1 | 6/2007 | Anh et al. | |
| 7,518,007 B2 | 4/2009 | Seo et al. | |
| 7,786,462 B2 | 8/2010 | Kostylev et al. | |
| 7,791,932 B2 | 9/2010 | Kuh et al. | |
| 8,133,429 B2 | 3/2012 | Ha et al. | |
| 8,330,136 B2 | 12/2012 | Zheng et al. | |
| 2009/0050869 A1* | 2/2009 | Kim ................ | H01L 27/2436 257/2 |
| 2011/0084240 A1 | 4/2011 | Schell et al. | |
| 2012/0115315 A1 | 5/2012 | Zheng | |
| 2012/0315737 A1* | 12/2012 | Kang ................ | H01L 45/06 438/381 |
| 2013/0078475 A1* | 3/2013 | Zheng ............... | C01B 19/002 428/457 |

* cited by examiner

*Primary Examiner* — David Vu
*Assistant Examiner* — Mouloucoulaye Inoussa
(74) *Attorney, Agent, or Firm* — Harness, Dickey & Pierce, P.L.C.

(57) ABSTRACT

A phase change material layer includes germanium (Ge), antimony (Sb), tellurium (Te) and at least one impurity elements. An atomic concentration of impurity elements ranges from about $0<a\le$ about 0.25 and an atomic concentration of antimony (Sb) ranges from about $0.03<c\le$ about 0.15.

18 Claims, 21 Drawing Sheets

SECOND        FIRST
DIRECTION   DIRECTION

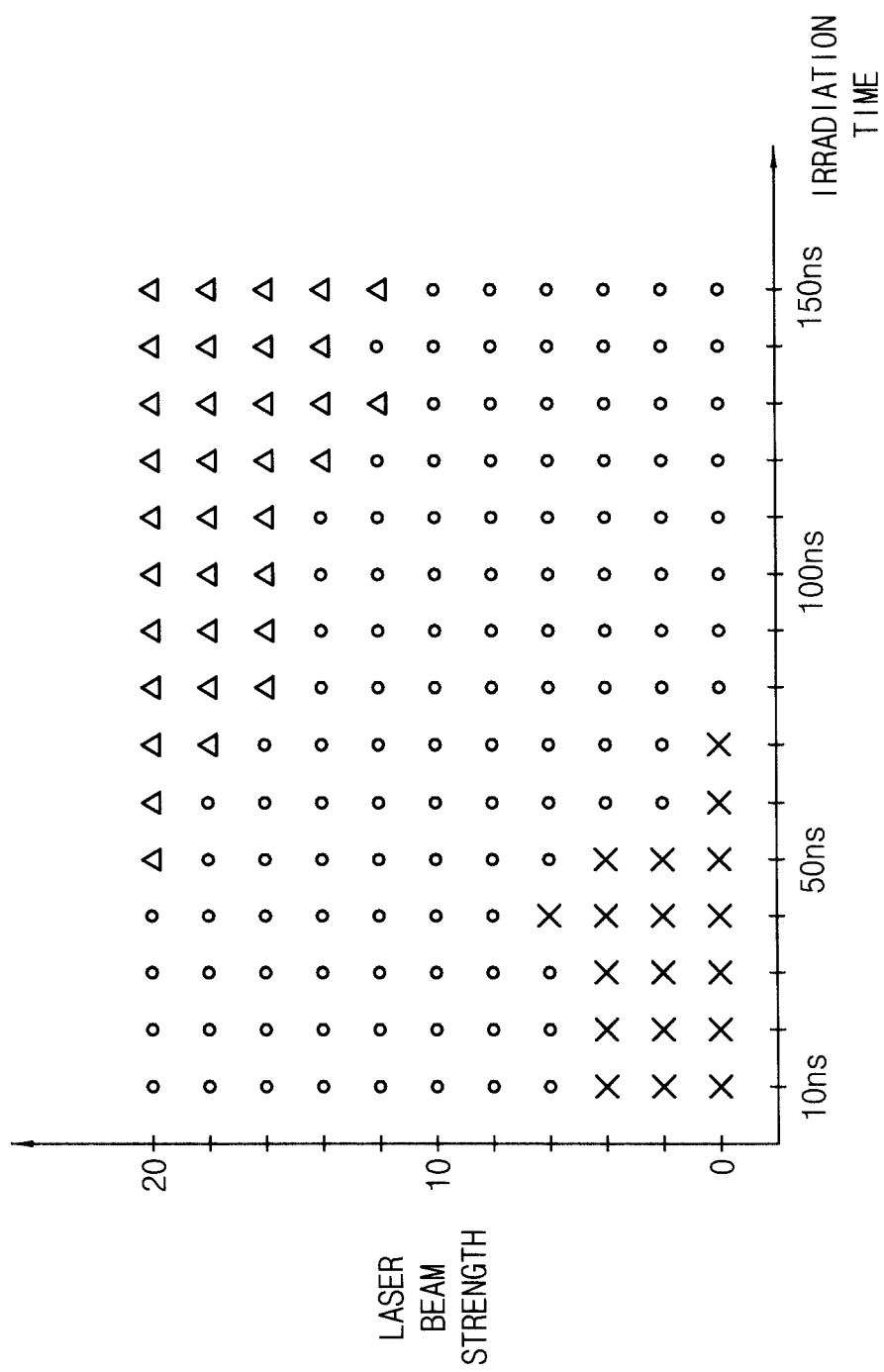

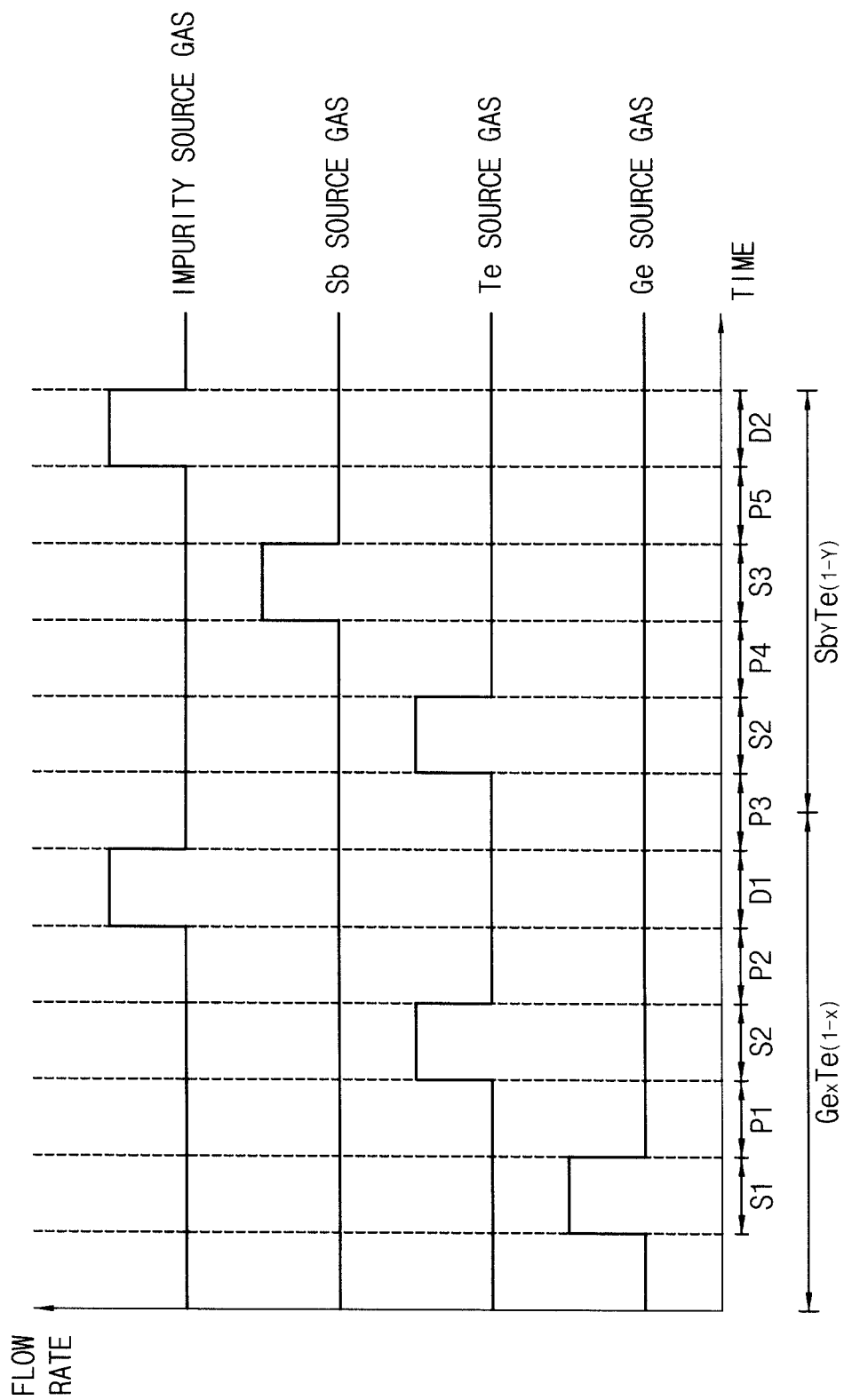

SECOND DIRECTION
⊗ ⟶ FIRST DIRECTION

FIRST DIRECTION
⊗ ⟶ SECOND DIRECTION

SECOND DIRECTION
⊗ ⟶ FIRST DIRECTION

FIRST DIRECTION
⊗ ⟶ SECOND DIRECTION

SECOND DIRECTION
⊗ ⟶ FIRST DIRECTION

FIRST DIRECTION
⊗ ⟶ SECOND DIRECTION

SECOND DIRECTION
⊗ ⟶ FIRST DIRECTION

FIRST DIRECTION
⊗ → SECOND DIRECTION

SECOND DIRECTION
⊗ → FIRST DIRECTION

FIRST DIRECTION
⊗ ⟶ SECOND DIRECTION

SECOND DIRECTION
⊗ ⟶ FIRST DIRECTION

FIRST DIRECTION
⊗ ⟶ SECOND DIRECTION

SECOND DIRECTION
⊗ ⟶ FIRST DIRECTION

FIRST DIRECTION
⊗ ⟶ SECOND DIRECTION

SECOND DIRECTION
⊗ ⟶ FIRST DIRECTION

FIRST DIRECTION
⊗⟶ SECOND DIRECTION

SECOND DIRECTION
⊗⟶ FIRST DIRECTION

FIRST DIRECTION
⊗ ⟶ SECOND DIRECTION

SECOND DIRECTION
⊗ ⟶ FIRST DIRECTION

FIRST DIRECTION
⊗ ⟶ SECOND DIRECTION

PHASE CHANGE MATERIAL LAYERS

CROSS-REFERENCE TO RELATED APPLICATION

This application claims priority under 35 USC §119 to Korean Patent Application No. 10-2013-0092857, filed on Aug. 6, 2013 in the Korean Intellectual Property Office (KIPO), the contents of which are herein incorporated by reference in their entirety.

BACKGROUND

1. Field

At least one example embodiment relates to phase change material layers and/or a method of manufacturing the same.

2. Description of the Related Art

A phase change memory device is a device for storing data using a resistance change generated by a phase transition between an amorphous state and a crystalline state of a phase change material layer pattern.

During the operation of the phase change memory device, a current is applied to the phase change material layer, and a joule heat is generated in the phase change material layer. The joule heat may transform the phase change material layer to an amorphous state or to a crystalline state. That is, the write speed of the phase change memory device is typically determined by the crystallization rate of the phase change material layer.

Generally, a calcogenide compound (e.g., GeSbTe) is used as the phase change material layer. However, there may be a trade-off between the crystallization rate and a thermal stability of the phase change material layer.

SUMMARY

At least one example embodiment provides a phase change material layer having an improved thermal stability and/or an improved crystallization rate.

At least one example embodiment provides a method of manufacturing the phase change material layer having an improved thermal stability and/or an improved crystallization rate.

According to at least one example embodiment, there is provided a phase change material layer including germanium (Ge), antimony (Sb), tellurium (Te) and at least one impurity elements. In an example embodiment of the phase change material, an atomic concentration "a" of impurity elements ranges from about $0 < a \leq$ about 0.25, and an atomic concentration "c" of antimony (Sb) ranges from about $0.03 < c \leq$ about 0.15.

In at least one example embodiment, the atomic concentration of antimony (Sb) may range from about $0.07 \leq c \leq$ about 0.09.

In at least one example embodiment, an atomic concentration "b" of germanium (Ge) may range from about $0.3 \leq b <$ about 0.55.

In at least one example embodiment, the atomic concentration of impurity elements may range from about $0 < a \leq$ about 0.2. The atomic concentration of germanium (Ge) may range from about $0.35 \leq b <$ about 0.47.

In at least one example embodiment, the impurity elements may include boron (B), carbon (C), nitrogen (N), oxygen (O), aluminum (Al), silicon (Si), phosphorus (P) or sulfur (S).

In at least one example embodiment, the impurity elements may include bismuth (Bi).

In at least one example embodiment, a 10 years guaranteed operating temperature of the phase change material layer may be above about 70° C.

In at least one example embodiment, the phase change material layer may have a crystallization rate at a temperature above the crystallization temperature which is larger than the crystallization rates of GeTe and $Ge_2Sb_2Te_5$.

In at least one example embodiment, the phase change material layer may include a first impurity elements and a second impurity elements which are selected from boron (B), carbon (C), nitrogen (N), oxygen (O), aluminum (Al), silicon (Si), phosphorus (P) and sulfur (S). A sum of amounts of the first and second impurity elements may ranges from about $0 < a1 + a2 \leq$ about 0.2.

According to at least one example embodiment, there is provided a phase change material layer including germanium (Ge), antimony (Sb), tellurium (Te) and at least one impurity element. A 10 years guaranteed operating temperature of the phase change material layer may be above about 70° C. The phase change material layer may have a crystallization rate at a temperature above the crystallization temperature which is larger than the crystallization rates of GeTe and $Ge_2Sb_2Te_5$.

According to at least one example embodiment, there is provided a phase change material including a phase change material layer comprising a quaternary compound. The quaternary compound may include GeSbTe doped with at least one of impurity element. The composition of GeSbTe is located in an area surrounded by a first composition line of atomic concentration of antimony (Sb) of about 0.03, a second composition line of atomic concentration of antimony (Sb) of about 0.15, a third composition line of atomic concentration of germanium (Ge) of about 0.3 and a fourth composition line of atomic concentration of germanium (Ge) of about 0.55.

In at least one example embodiment, the composition of GeSbTe may be overlapped with a tie line between GeTe and $Sb_2Te_3$.

According to at least one example embodiment, a method of manufacturing a phase change material layer is provided. In the example method, a first cycle is performed to form a $Ge_xTe_{(1-x)}$ layer on a substrate. The first cycle may include a step for supplying a Ge source gas and a step for supplying a Te source gas. A second cycle is performed to form a $Sb_yTe_{(1-y)}$ layer on the substrate. The second cycle may include a step for supplying a Sb source gas and a step for supplying the Te source gas. The first cycle or the second cycle may also include a step for supplying an impurity source gas.

In at least one example embodiment, the second cycle may be performed once, while the first cycle may be performed several times.

In at least one example embodiment, the first cycle may be performed to form a GeTe layer, and the second cycle may be performed to form a $Sb_2Te_3$ layer.

According to at least one example embodiment, the phase change material layer may have an improved thermal stability and an improved crystallization rate. Particularly, when the atomic concentration of antimony (Sb) ranges from about $0.07 \leq c \leq$ about 0.09, a 10 years guaranteed operating temperature of the phase change material layer is above about 70° C., and the phase change material layer has a crystallization rate at a temperature above the crystallization temperature which is larger than the crystallization rates of GeTe and $Ge_2Sb_2Te_5$.

According to at least one example embodiment, a phase change device includes a lower electrode and an upper electrode, and a phase change material layer provided between the lower electrode and the upper electrode, the phase change material layer being configured to undergo a phase transition from one of an amorphous state and a crystalline state to another of the amorphous state and the crystalline state when a voltage is applied between the lower electrode and the upper electrode, a crystallization rate of the phase change material layer at a temperature above a crystallization temperature of the phase change material layer being larger than crystallization rates of GeTe and $Ge_2Sb_2Te_5$.

BRIEF DESCRIPTION OF THE DRAWINGS

At least one example embodiment will be more clearly understood from the following detailed description taken in conjunction with the accompanying drawings. FIGS. 1 to 35 represent non-limiting, at least one example embodiment as described herein.

FIG. 1 is a perspective view illustrating a phase-change memory device in accordance with at least one example embodiment;

FIG. 2 is a cross-sectional view illustrating a phase-change memory device in accordance with at least one example embodiment;

FIG. 3 is a cross-sectional view illustrating a phase-change memory device in accordance with at least one example embodiment;

FIG. 4 is a cross-sectional view illustrating a phase-change memory device in accordance with at least one example embodiment;

FIG. 5 is a cross-sectional view illustrating a phase-change memory device in accordance with at least one example embodiment;

FIG. 6 is a graph showing a thermal stability of phase change material layers in accordance with at least one example embodiment and a comparative embodiment;

FIGS. 8A and 8B are graphs showing a crystallization rate of phase change material layers in accordance with an example embodiment and a comparative embodiment;

FIGS. 10A and 10B are diagrams illustrating a method of manufacturing a phase change material layer in accordance with at least one example embodiment;

FIGS. 11 to 34 are cross-sectional views illustrating a method of manufacturing a phase-change memory device in accordance with some example embodiment; and FIG. 35 is a schematic block diagram illustrating an example of computing systems including a phase change memory device according to at least one example embodiment of the present disclosure.

DETAILED DESCRIPTION

Figure 1:
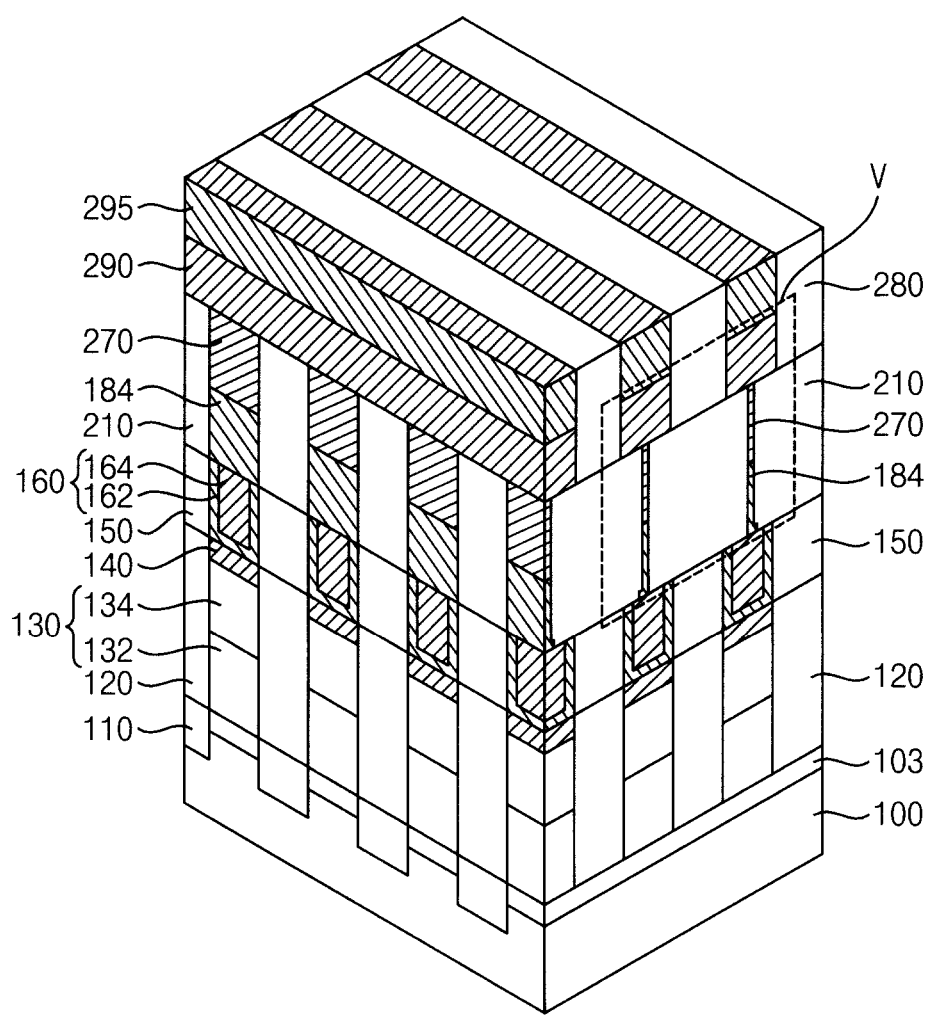

At least one example embodiment will now be described more fully with reference to the accompanying drawings, in which at least one example embodiment is shown. At least one example embodiment may, however, be embodied in many different forms and should not be construed as limited to the at least one example embodiment set forth herein. In the drawings, the thicknesses of layers and regions are exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the at least one example embodiment.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular at least one example embodiment only and is not intended to be limiting of at least one example embodiment. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

At least one example embodiment is described herein with reference to cross-sectional illustrations that are schematic illustrations of idealized one or more example embodiments (and intermediate structures). As such, variations from the shapes of the illustrations as a result, for example, of manufacturing techniques and/or tolerances, are to be expected. Thus, at least one example embodiment should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

It will be further understood that the terms "atomic concentration" when used in this specification, specify a ratio of specific element contained in the material. That is, the "atomic concentration" may be equal to the number of specific element divided by the number of all elements in the material. For example, in case of a GeTe material, an atomic concentration of Ge is 0.5, and an atomic concentration of Te is also 0.5. In case of $Ge_2Sb_2Te_5$, an atomic concentration of Ge is 2/9, and an atomic concentration of Te is also 5/9, and an atomic concentration of the Sb is 2/9.

The atomic concentration in a specific element in the material may be measured by an X-ray photoelectron spectroscopy (XPS), a secondary ion mass spectroscopy (SIMS) and a transmission electron microscopy (TEM), etc.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Phase-Change Memory Device

FIG. 1 is a perspective view illustrating a phase-change memory device in accordance with at least one example embodiment.

Referring to FIG. 1, the phase-change memory device may include a word line 103, a switching unit, a phase-change memory unit and a bit line 295. Further, the phase-change memory device may include a plug 160 and an ohmic pattern 140.

The substrate 100 may include a semiconductor substrate, e.g., a silicon substrate, a germanium substrate, a silicon on insulator (SOI) substrate, a germanium on insulator (GOI) substrate, etc.

According to at least one example embodiment, the substrate 100 may be divided into an active region and a field region by an isolation layer pattern 110. That is, one region where the isolation layer pattern 110 is disposed may be defined as the field region, and another region where the isolation layer pattern 110 is not disposed may be defined as the active region. In at least one example embodiment, a plurality of isolation layer patterns 110 may be arranged in a first direction parallel to a top surface of the substrate 100, and each of the isolation layer patterns 110 may extend in a second direction perpendicular to the first direction. For example, the isolation layer pattern 110 may include a silicon oxide, e.g., boro-phospho silicate glass (BPSG), phospho-silicate glass (PSG), undoped silicate glass (USG), flowable oxide (FOX), tetra-ethyl ortho-silicate (TEOS), plasma enhanced tetra-ethyl ortho-silicate (PE-TEOS), high density plasma chemical vapor deposition (HDP-CVD) oxide, etc.

The word line 103 may be disposed at an upper portion of the active region of the substrate 100. Therefore, a plurality of word lines 103 may be arranged in the first direction, and each of the word lines 103 may extend in the second direction. In at least one example embodiment, the word line 103 may include n-type impurities, e.g., phosphorous, arsenic, etc. or p-type impurities, e.g., boron, gallium, etc.

The switching unit may include a diode 130 or a transistor. In at least one example embodiment, the switching unit may include the diode 130 which may be electrically connected to the word line 103 by a first opening penetrating a first insulation layer 120 on the substrate 100. Further, the first insulation layer 120 may include an insulation material such as silicon oxide.

In at least one example embodiment, a plurality of first openings may be arranged in the second direction, such that the plurality of first openings may expose the word lines. Therefore, a plurality of diodes 130 may be arranged in the first direction and the second direction, thereby forming a diode array.

Each of the diodes 130 may include a lower diode layer 132 and an upper diode layer 134. In at least one example embodiment, the lower diode layer 132 and the upper diode layer 134 may include silicon doped with impurities. For example, the lower diode layer 132 may include n-type impurities, e.g., phosphorous, arsenic, etc., and the upper diode layer 134 may include p-type impurities, e.g., boron, gallium, etc.

The ohmic pattern 140 may be disposed on the diode 130 to fill a remaining portion of the first opening. In at least one example embodiment, the ohmic pattern 140 may include a metal silicide, e.g., cobalt silicide, nickel silicide, tungsten silicide, etc. The ohmic pattern 140 may reduce an electrical contact resistance between the diode 130 and the plug 160. In at least one other example embodiment, the ohmic pattern 140 may be omitted.

The plug 160 may fill a second opening which may penetrate the second insulation layer 150 on the first insulation layer 120. The plug 160 may be electrically connected to the ohmic pattern 140. For example, the second insulation layer 150 may include an insulation material such as silicon oxide.

In at least one example embodiment, the plug 160 may include a barrier layer pattern 162 and a conductive layer pattern 164. The barrier layer pattern 162 may be disposed on a bottom surface and a sidewall of the second opening, and the conductive layer pattern 164 may fill the remaining portion of the second opening. In at least one other example embodiment, the plug 160 may be omitted.

The phase-change memory unit may include a lower electrode 184, a phase change material layer pattern 270 and an upper electrode 290.

The lower electrode 184 may be disposed on the plug 160. The lower electrode 184 may serve to heat the phase-change material layer pattern 270. In at least one example embodiment, the lower electrode 184 may have a cross-section which may be a rectangular shape or a trapezoidal shape having a larger bottom side, when viewed in the first direction.

Further, the lower electrode 184 may have a cross-section which may be "L" shape, when viewed in the second direction. According as the lower electrode 184 may have the cross-section of an "L" shape, a contact area between the lower electrode 184 and the plug 160 may be larger than a contact area between the lower electrode 184 and the phase change materials layer pattern 270 subsequently formed, so that the phase change material layer pattern 270 may be efficiently heated even with a small current.

In at least one example embodiment, the lower electrode 184 may include a metal, e.g., tungsten, aluminum, copper, tantalum, titanium, molybdenum, niobium, zirconium, nitride thereof, silicide thereof, etc. There may be used alone or in a combination thereof.

The phase change material layer pattern 270 may be disposed on the lower electrode 184. In at least one example embodiment, a bottom surface of the phase change material layer pattern 270 may correspond to a top surface of the lower electrode 184. The phase change material layer pattern 270 may include a chalcogenide compound (e.g., GeSbTe (GST)) doped with at least one of impurities (X). The composition the phase change material layer pattern 270 may be described with reference to FIGS. 6 and 7.

On the other hand, the third insulation layer 210 may surround the lower electrode 184 and the phase change material layer pattern 270. For example, the third insulation layer 210 may include an insulation material such as silicon oxide.

The upper electrode 290 may be disposed on the third insulation layer 210 to contact the phase change material layer pattern 270. For example, the upper electrode 290 may include a material substantially the same as or similar to that of the lower electrode 184.

Further, the bit line 295 may be disposed on the upper electrode 290. For example, the bit line 295 may include a metal such as copper, aluminum, tungsten, etc. In at least one example embodiment, a plurality of bit lines 295 may be arranged in the second direction, and each of the bit lines 295 may extend in the first direction.

During a write operation of the phase change memory device, when the lower electrode 184 may heat the phase change material layer pattern 270 at a temperature above a melting temperature Tm, and the phase change material layer pattern 270 may be cooled, a phase transformation of the phase change material layer pattern 270 may occur from a crystalline state to an amorphous state (that is, a reset operation). When the lower electrode 184 may heat the phase change material layer pattern 270 at a temperature between a crystallization temperature Tc and the melting temperature Tm, and the phase change material layer pattern 270 may be cooled, a phase transformation of the phase change material layer pattern 270 may occur from the amorphous state to the crystalline state (that is, a set operation). The phase change material layer pattern 270 in the amorphous state may have a larger electrical resistance than the electrical resistance of the phase change material layer pattern 270 in the crystalline state. Therefore, a data stored in the phase change memory unit may be read by detecting the electrical resistance of the phase change material layer pattern 270 during a read operation of the phase change memory device.

The write speed of the phase change memory device may be determined by a crystallization temperature, a melting temperature and a crystallization rate of the phase change material layer pattern 270. That is, when a crystallization temperature and a melting temperature of the phase change material layer pattern 270 increases, the crystallization rate of the phase change material layer pattern 270 may decrease. Alternatively, when the crystallization temperature and the melting temperature of the phase change material layer pattern 270 decreases, the crystallization rate of the phase change material layer pattern 270 may increase, thereby increasing the write speed of the phase change memory device.

Further, a data retention characteristic of the phase change memory device may depend on the phase change material layer pattern 270. The phase change material layer pattern 270 having the amorphous state may be slowly crystallized at a temperature below the crystallization temperature Tc, so that the data stored in the phase change memory unit may be lost. That is, the phase change material layer pattern 270 capable of maintaining the amorphous state or the crystalline state may have the improved thermal stability or the improved data retention characteristic. Generally, when a crystallization temperature and a melting temperature of the phase change material layer pattern 270 increases, the thermal stability of the phase change memory device may increase.

The phase change material layer pattern 270 in accordance with at least one example embodiment may have the improved crystallization rate and the improved thermal stability. Therefore, the phase change memory device including the phase change material layer pattern 270 may have the improved writing rate and the improved data retention characteristic.

According to at least one example embodiment, the structure of the phase change memory device may not be limited to FIG. 1. For example, the phase change memory device may have different structures as illustrated in FIGS. 2 to 6.

Figure 2:
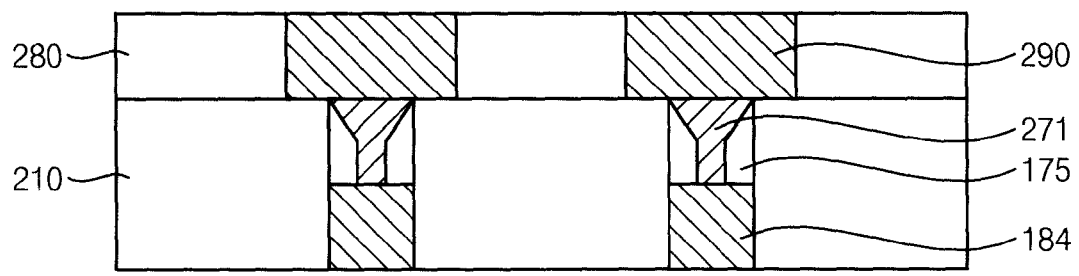

FIG. 2 is a cross-sectional view illustrating a phase-change memory device in accordance with at least one other example embodiment. The phase change memory device in FIG. 2 may be substantially the same as or similar to the phase change memory device in FIG. 1 except for a spacer 175.

In at least one example embodiment, the spacer 175 may be disposed on the lower electrode 184. Therefore, a contact area between the phase change material layer pattern 271 and the lower electrode 184 may decrease, and a heating efficiency of the lower electrode 184 may increase.

Figure 3:
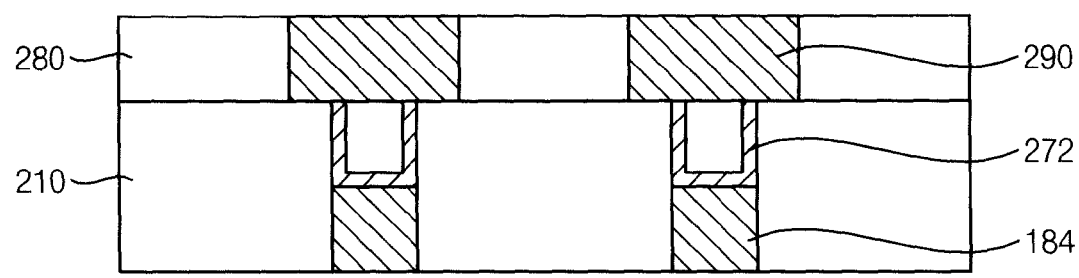

FIG. 3 is a cross-sectional view illustrating a phase-change memory device in accordance with at least one other example embodiment. The phase change memory device in FIG. 3 may be substantially the same as or similar to the phase change memory device in FIG. 1 except for a shape of a phase change material layer pattern 272.

In at least one example embodiment, the phase change material layer pattern 272 may have a "U" shape on the lower electrode 184. Therefore, a volume of the phase change material layer pattern 272 may decrease, and a required energy for a phase transformation of the phase change material layer pattern 272 may decrease.

Figure 4:
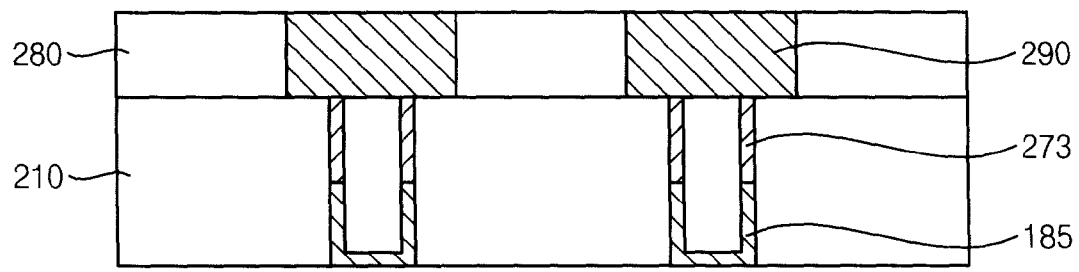

FIG. 4 is a cross-sectional view illustrating a phase-change memory device in accordance with at least one other example embodiment. The phase change memory device in FIG. 4 may be substantially the same as or similar to the phase change memory device in FIG. 1 except for shapes of a phase change material layer pattern 273 and a lower electrode 185.

In at least one example embodiment, the lower electrode 185 may have "U" shape on a plug (not illustrated), and the phase change material layer pattern 273 may have a uniform thickness on the lower electrode 185. Therefore, a contact area between the phase change material layer pattern 273 and the lower electrode 185 may decrease, and an area of a top surface of the lower electrode 185 may decrease, thereby improving a heating efficiency.

Figure 5:
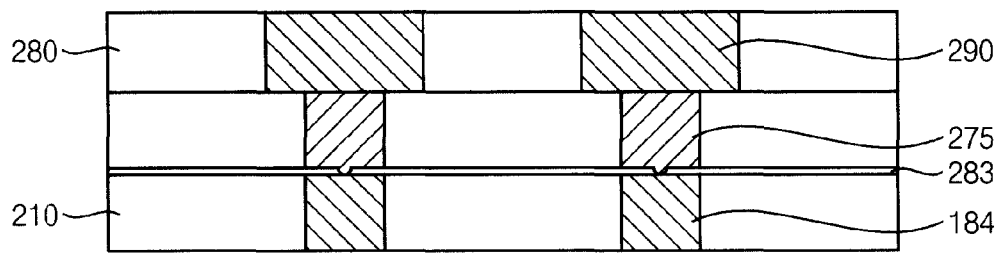

FIG. 5 is a cross-sectional view illustrating a phase-change memory device in accordance with at least one other example embodiment. The phase change memory device in FIG. 5 may be substantially the same as or similar to the phase change memory device in FIG. 1 except for shapes of an etch stop layer 283.

In at least one example embodiment, the etch stop layer 283 may be disposed between the lower electrode 184 and the phase change material layer pattern 275, and the phase change material layer pattern 275 may directly contact the lower electrode 184 through a contact hole penetrating the etch stop layer 283. Therefore, a contact area between the phase change material layer pattern 275 and the lower electrode 184 may decrease, and a heating efficiency of the lower electrode 184 may increase.

Phase Change Material Layer

According to at least one example embodiment, the phase change material layer may include a chalcogenide compound (e.g., GeSbTe (GST)) doped with at least one of impurities (X). That is, the at least one of impurities (X) selected from group III, group IV, group V and group VI may be doped into the Ge—Sb—Te system.

In at least one example embodiment, the composition of the phase change material layer is defined as $X_a Ge_b Sb_c Te_{1-(a+b+c)}$.

According to at least one example embodiment, the impurities (X) may be selected from boron (B), carbon (C), nitrogen (N), oxygen (O), aluminum (Al), silicon (Si), phosphorus (P) and sulfur (S). Particularly, the impurities (X) may be selected from carbon (C), nitrogen (N) and oxygen (O). Alternatively, the impurities may be bismuth (Bi).

"a" which is an atomic concentration of the impurity element (X) may be equal to or lower than 0.25 (that is, $0<a\leq0.25$). Particularly, the atomic concentration of the impurity element (X) may be equal to or lower than 0.2, and may be higher than 0 (that is, $0<a\leq0.2$).

"b" which is an atomic concentration of germanium (Ge) may be equal to or higher than 0.3 and lower than 0.55 (that is, $0.3\leq b<0.55$). Particularly, the atomic concentration of germanium (Ge) may be equal to or higher than 0.35 and lower than 0.47 (that is, $0.35\leq b<0.47$). If the atomic concentration of germanium (Ge) is above about 0.55, the crystallization temperature of the phase change material layer is too high, so that the crystallization rates of the phase change material layer decease. If the atomic concentration of germanium (Ge) is below about 0.3, the phase change material layer having the amorphous state may have a relatively low thermal stability.

"c" which is an atomic concentration of antimony (Sb) may be higher than 0.03 and equal to or lower than 0.15 (that is, $0.03<c\leq0.15$). Particularly, the atomic concentration of antimony (Sb) may be equal to or higher than 0.07 and equal to or lower than 0.09 (that is, $0.07\leq b\leq0.09$). If the atomic concentration of antimony (Sb) is below about 0.03, the phase change material layer having the amorphous state may have a relatively low thermal stability. If the atomic concentration of antimony (Sb) is above about 0.15, the crystallization rates of the phase change material layer decease. The crystallization rate and the thermal stability of the phase change material layer depending on the atomic concentration of antimony (Sb) will be described with reference to FIGS. 9A and 9B.

Consequently, the phase change material layer may include a chalcogenide compound (e.g., GeSbTe (GST)) doped with at least one of impurities (X), where the atomic concentration of antimony (Sb) is between about 0.03 and about 0.15, and the atomic concentration of impurity element (X) may be below about 0.25. Therefore, the phase change material layer may have the improved crystallization rate and the improved thermal stability.

In at least one other example embodiment, a chalcogenide compound (e.g., GeSbTe (GST)) doped with at least two of impurities (X, Y). The composition of the phase change material layer is defined as $X_{a1} Y_{a2} Ge_b Sb_c Te_{1-(a+b+c)}$.

The first impurity (X) and the second impurity (Y) may be selected from boron (B), carbon (C), nitrogen (N), oxygen (O), aluminum (Al), silicon (Si), phosphorus (P) and sulfur (S). Particularly, the first impurity (X) and the second impurity (Y) may be selected from carbon (C), nitrogen (N) and oxygen (O). Alternatively, the first impurity (X) or the second impurity (Y) may be bismuth (Bi).

A sum of an atomic concentration "a1" of the first impurity (X) and an atomic concentration "a2" of the second impurity (Y) may be equal to or lower than 0.25 (that is, $0<a1+a2\leq0.25$). Particularly, the sum of an atomic concentrations of the first impurity (X) and the second impurity (Y) may be equal to or lower than 0.2, and may be higher than 0 (that is, $0<a1+a2\leq0.2$).

"b" which is an atomic concentration of germanium (Ge) may be equal to or higher than 0.3 and lower than 0.55 (that is, $0.3\leq b<0.55$). Particularly, the atomic concentration of germanium (Ge) may be equal to or higher than 0.35 and lower than 0.47 (that is, $0.35\leq b<0.47$).

"c" which is an atomic concentration of antimony (Sb) may be higher than 0.03 and equal to or lower than 0.15 (that is, $0.03<b\leq0.15$). Particularly, the atomic concentration of germanium (Ge) may be equal to or higher than 0.07 and equal to or lower than 0.09 (that is, $0.07\leq b\leq0.09$). If the atomic concentration of antimony (Sb) is below about 0.03, the phase change material layer having the amorphous state may have a relatively low thermal stability. If the atomic concentration of antimony (Sb) is above about 0.15, the crystallization rates of the phase change material layer decease.

Consequently, the phase change material layer may include a chalcogenide compound (e.g., GeSbTe (GST)) doped with at least two of impurities (X, Y), where the atomic concentration of antimony (Sb) is between about 0.03 and about 0.15, and the sum of the atomic concentrations of impurity elements (X, Y) may be below about 0.25. Therefore, the phase change material layer may have an improved crystallization rate and the improved thermal stability.

Figure 6:
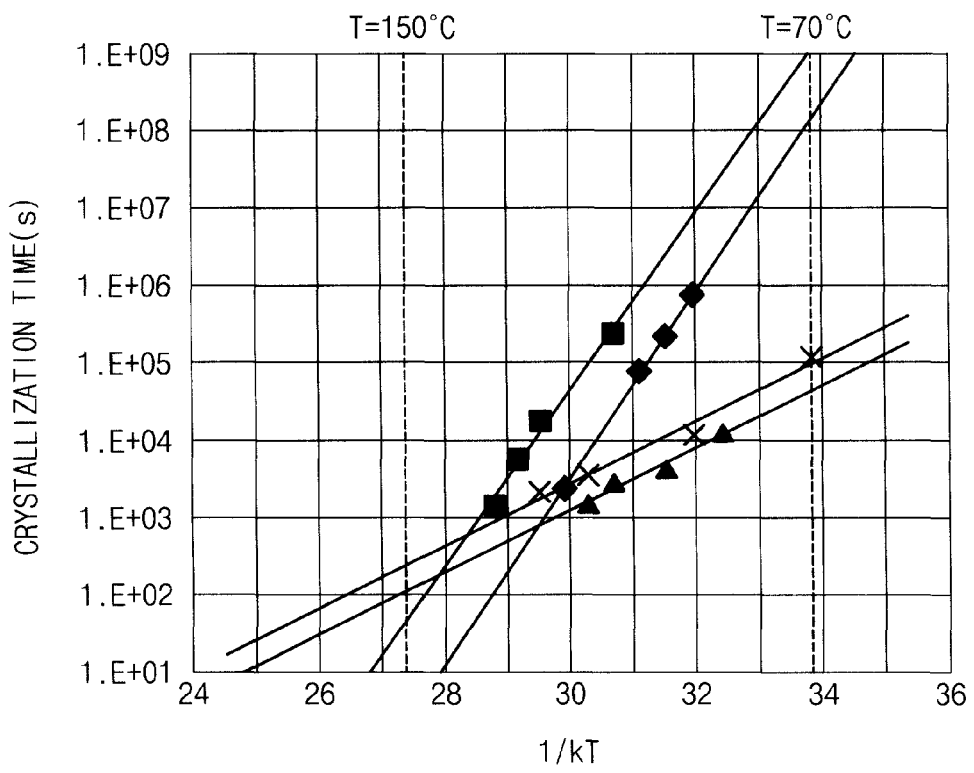
Figure 7A:
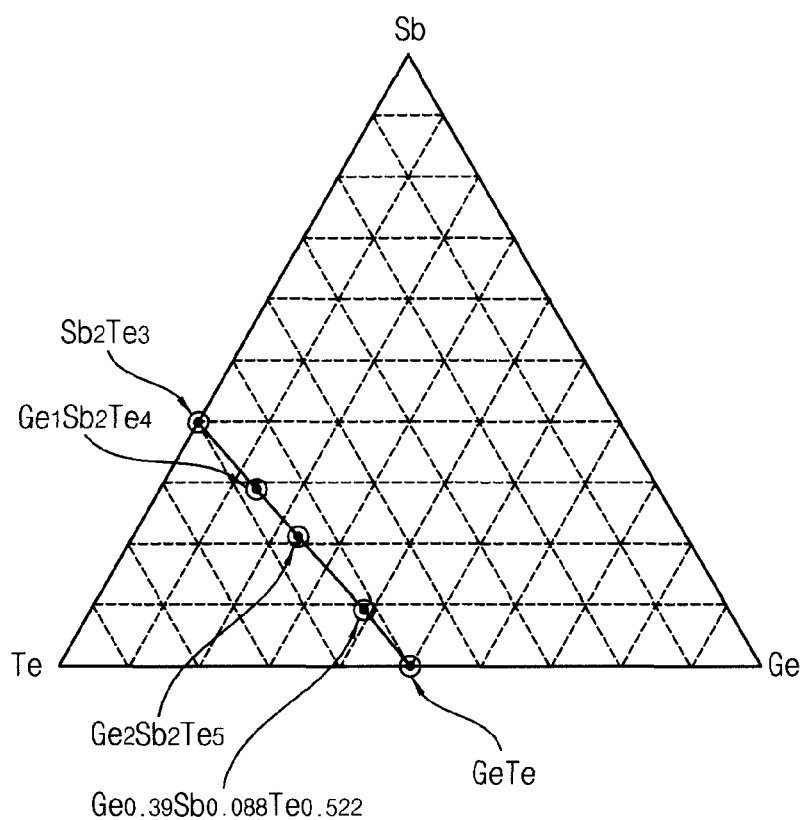
FIGS. 7A and 7B are Ge—Sb—Te ternary phase diagrams showing compositions of GST materials.

FIG. 6 is a graph showing a thermal stability of phase change material layers in accordance with an example embodiment and a comparative embodiment, and FIG. 7A is Ge—Sb—Te ternary phase diagrams showing compositions of GST materials.

In FIG. 6, the "X" axis represents 1/kT, wherein T represents temperature, and k represents Boltzmann constant. The "Y" axis represents a log scale value of a crystallization time of the phase change material layer.

According to at least one example embodiment, when a crystallization time of the phase change material layer increases, the phase change material layer may have an improved data retention characteristic. Generally, when the phase change material layer is used in the phase change memory device, the phase change memory device may need to guarantee to store an amount of data for, for example, 10 years. That is, when the 10 years operating temperature increases, the phase change material layer may have an improved data retention characteristic.

In FIG. 6, the experimental embodiment 1 represents a phase change material layer having a composition of $Ge_{0.39}Sb_{0.088}Te_{0.522}$ doped with Carbon (C). That is, the phase change material layer of the experimental embodiment 1 may have a composition of $C_a(Ge_{0.39}Sb_{0.088}$ $Te_{0.522})_{(1-a)}$, and the atomic concentration "a" of carbon (C) may be may be equal to or lower than 0.2, and may be higher than 0 (that is, 0<a≤0.2).

On the other hand, the comparative embodiment 1 may represent a phase change material layer having a composition of $Ge_2Sb_2Te_5$, the comparative embodiment 2 may represent a phase change material layer having a composition of GeTe, comparative embodiment 3 may represent a phase change material layer having a composition of $Ge_1Sb_2Te_4$. As illustrated in FIG. 7A, the compositions of $Ge_2Sb_2Te_5$, GeTe and $Ge_1Sb_2Te_4$ are disposed on a tie line between $Sb_2Te_3$ and GeTe of the ternary phase diagram.

Referring to FIG. 6, the phase change material layer of the experimental embodiment 1 may have a longer crystallization time at a temperature of about 70° C. than the crystallization rates of the comparative embodiments. That is, the phase change material layer of the experimental embodiment 1 may have an improved thermal stability compared to those of the comparative embodiments.

Figure 8A:
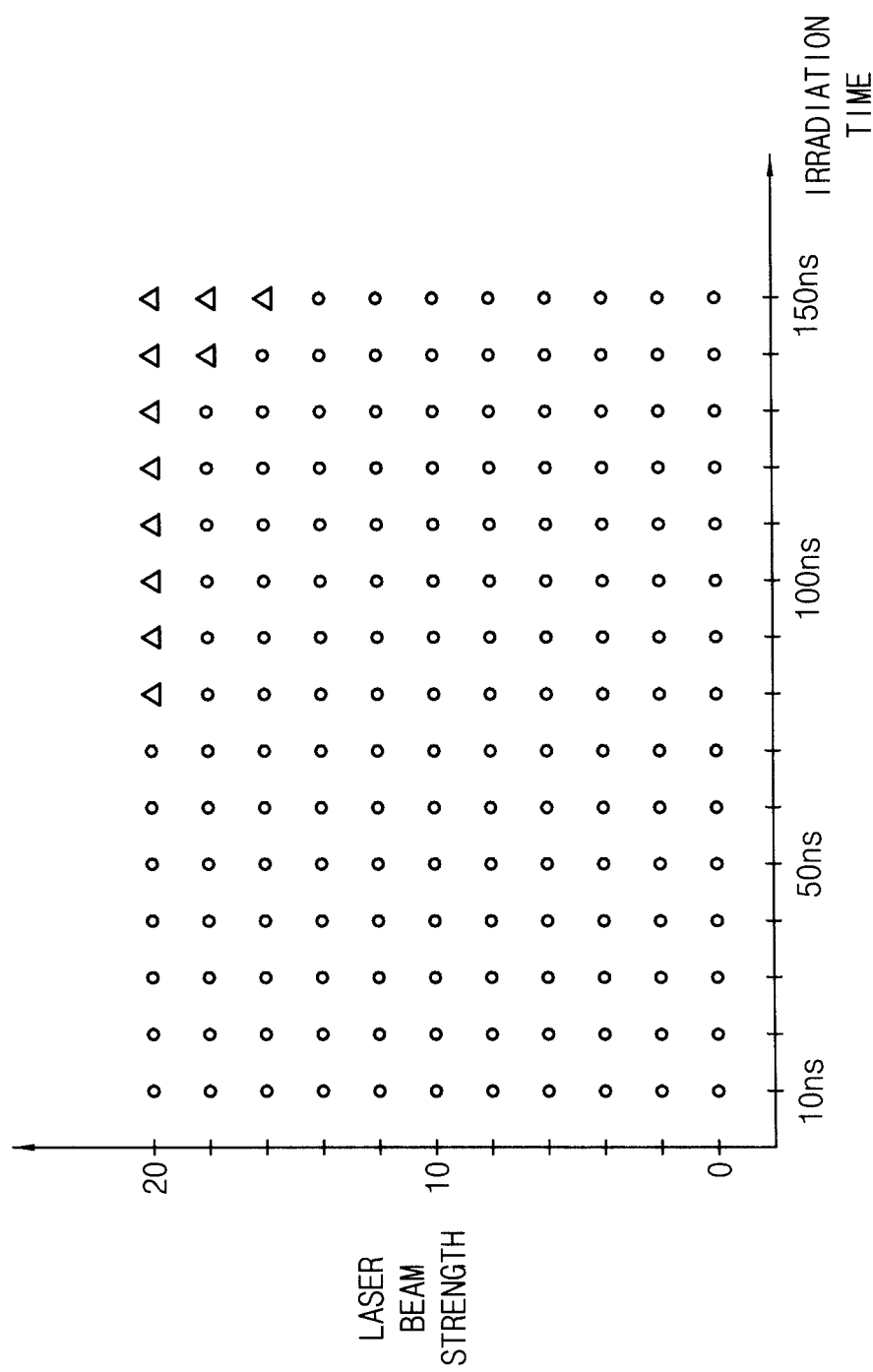

FIGS. 8A and 8B are graphs showing a crystallization rate of phase change material layers in accordance with an example embodiment and a comparative embodiment. FIG. 8A shows a crystallization rate of phase change material layers having a composition of $Ge_{0.39}Sb_{0.088}Te_{0.522}$ doped with Carbon (C) in accordance with at least one example embodiment, and FIG. 8B shows a crystallization rate of phase change material layers having a composition of GeTe in accordance with comparative embodiments.

In FIGS. 8A and 8B, the "X" axis represents an irradiation time of the crystallizing laser, and the "Y" axis represents strength of the crystallizing laser. Further, the "X" mark in the graph means uncrystallized state, the "Δ" mark in the graph means a damaged state by the laser beam, and the "O" mark means crystalline state.

Referring to FIG. 8A, the phase change material layers in accordance with at least one example embodiment (that is, the phase change material layers having a composition of $Ge_{0.39}Sb_{0.088}Te_{0.522}$ doped with Carbon (C)) were crystallized by a laser irradiation for 10 ns. While, the phase change material layers in accordance with comparative embodiments were not crystallized by a low strength laser irradiation for a relatively short time. That is, the phase change material layers in accordance with at least one example embodiment may have an improved crystallization rate compared to those of the comparative embodiments.

Table 1 shows the thermal stability and the crystallization rate of the phase change material layers in accordance with at least one example embodiment and comparative embodiments.

The experimental embodiment 1 represents a phase change material layer having a composition of $Ge_{0.39}Sb_{0.088}Te_{0.522}$ doped with Carbon (C), the experimental embodiment 2 represents a phase change material layer having a composition of $N_{0.05}Ge_{0.38}Sb_{0.095}Te_{0.475}$, and the experimental embodiment 3 represents a phase change material layer having a composition of $Bi_{0.1}Ge_{0.405}Sb_{0.045}Te_{0.45}$. On the other hand, the comparative embodiment 1 represents a phase change material layer having a composition of $Ge_2Sb_2Te_5$, the comparative embodiment 2 represents a phase change material layer having a composition of GeTe, and the comparative embodiment 3 represents a phase change material layer having a composition of $Ge_1Sb_2Te_4$. That is, the phase change material layers of the comparative embodiments may have higher atomic concentration of antimony (Sb) that those of at least one experimental embodiment.

According to at least one example embodiment, when determining the 10 years operating temperatures, the phase change material layers were formed, and the time required for transforming from the amorphous state to the crystalline state at a temperature below the crystallization temperature Tc was measured. The 10 years operating temperatures of the phase change material layers were determined as the maximum temperature at which the phase change material layer did not transform from the amorphous state to the crystalline state for 10 years. That is, as the 10 years operating temperature increases, the thermal stability of the phase change material layer may improve.

According to at least one example embodiment, when determining the crystallization time, the phase change material layers were formed, and the time required for transforming from the amorphous state to the crystalline state with laser beam irradiation was measured. That is, as the crystallization time decreases, the wiring speed of the phase change memory device may improve.

TABLE 1

|  | 10 years operating temperature | Crystallization time |
| --- | --- | --- |
| Experimental embodiment 1 | 75° C. | 10 ns |
| Experimental embodiment 2 | 75° C. | 10 ns |
| Experimental embodiment 3 | 40° C. | 10 ns |
| Comparative embodiment 1 ($Ge_2Sb_2Te_5$) | 67° C. | 150 ns |
| Comparative embodiment 2 (GeTe) | −7° C. | 30 ns |
| Comparative embodiment 3 ($Ge_1Sb_2Te_4$) | −1° C. | 10 ns |

Referring to Table 1, the phase change material layers in accordance with experimental embodiments 1 to 3 may have the improved crystallization rate and/or the improved thermal stability compared to those of the comparative embodiments 1 to 3. Particularly, the phase change material layers doped with carbon or nitrogen in accordance with experimental embodiments 1 and 2 may have an improved crystallization rate and an improved thermal stability compared to those of the comparative embodiments 1 to 3.

Figure 9A:
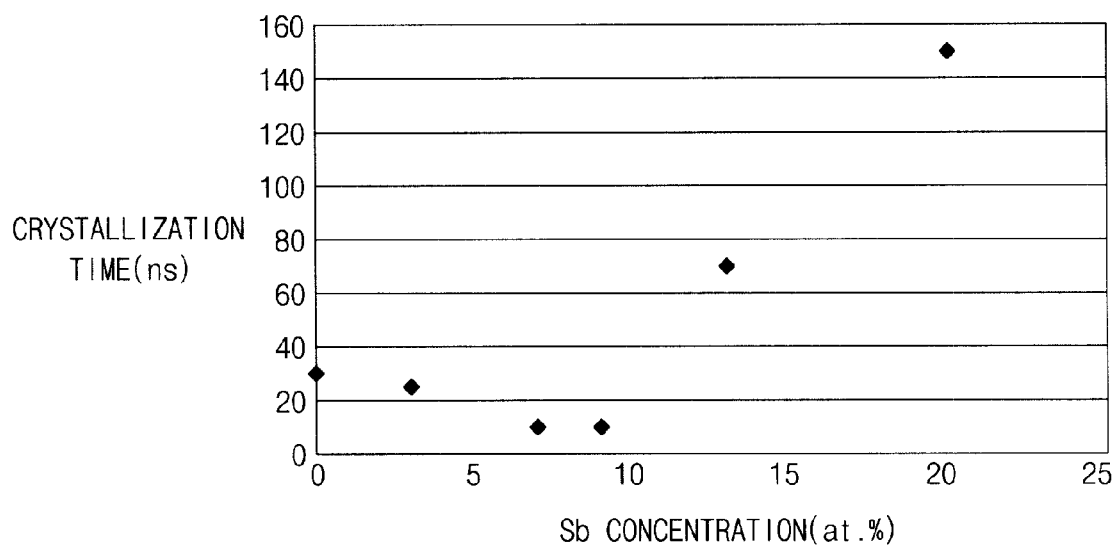
FIG. 9A is a graph showing a crystallization time of a phase change material layer depending on an atomic concentration of antimony (Sb).
Figure 9B:
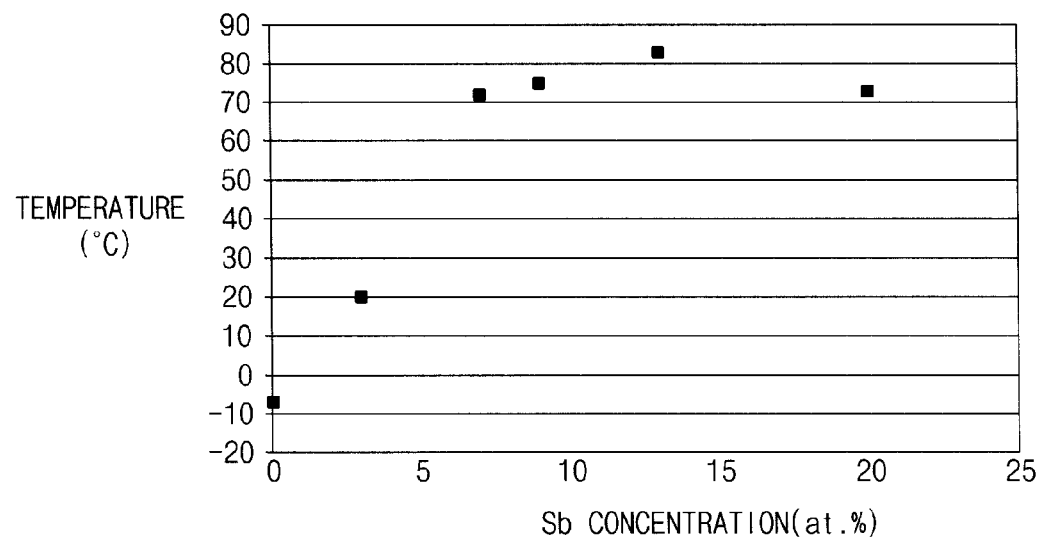
FIG. 9B is a graph showing a 10 years guaranteed operating temperature of a phase change material layer depending on an atomic concentration of antimony (Sb).

FIG. 9A is a graph showing a crystallization time of a phase change material layer depending on an atomic concentration of antimony (Sb), and FIG. 9B is a graph showing a 10 years guaranteed operating temperature of a phase change material layer depending on an atomic concentration of antimony (Sb).

According to at least one example embodiment, the phase change material layers of FIGS. 9A and 9B may include GeSbTe (GST) doped with carbon (C). The composition of the GST is disposed on disposed on a tie line between $Sb_2Te_3$ and GeTe of the ternary phase diagram of FIG. 7B, and the atomic concentration of antimony (Sb) is changed. That is, the composition of the phase change material layers is defined as $X_a(GeTe)_d(Sb_2Te_3)_e$.

Referring to FIG. 9a, as the atomic concentration of antimony (Sb) increases, the crystallization time of the phase change material layer changed. When the atomic concentration of antimony (Sb) is between 0 and about 0.07, the crystallization time decreased as the atomic concentration of antimony (Sb) increased. When the atomic concentration of antimony (Sb) is between 0.09 and about 0.2, the crystallization time increased as the atomic concentration of antimony (Sb) increased. That is, the slope of the curve changed at the atomic concentration of antimony (Sb) of about 0.09. The phase change material layer had the crystallization time below about 30 ns, when the atomic concentration of antimony (Sb) was higher than 0 and lower than or equal to about 0.09.

On the other hand, the phase change memory device may require the crystallization time below about 100 ns. Referring to FIG. 9A, the phase change material layer had the crystallization time below about 100 ns, when the atomic concentration of antimony (Sb) was higher than 0 and lower than or equal to about 0.15.

Referring to FIG. 9B, as the atomic concentration of antimony (Sb) increases, the 10 years guaranteed operating temperature of the phase change material layer increased. When the atomic concentration of antimony (Sb) is below about 0.03, the 10 years guaranteed operating temperature decreased abruptly. Particularly, the 10 years guaranteed operating temperature is above about 70° C., when the atomic concentration of antimony (Sb) is above about 0.07.

Consequently, when the phase change material layer may include a chalcogenide compound (e.g., GeSbTe (GST)) doped with at least two of impurities (X, Y), and the atomic concentration of antimony (Sb) is between about 0.03 and about 0.15, the phase change material layer may have an improved crystallization rate and an improved thermal stability at the same time. More particularly, when the atomic concentration of antimony (Sb) is between about 0.07 and about 0.09, the phase change material layer may have a crystallization rate below about 30 ns and the 10 years guaranteed operating temperature above about 70° C.

Figure 7B:
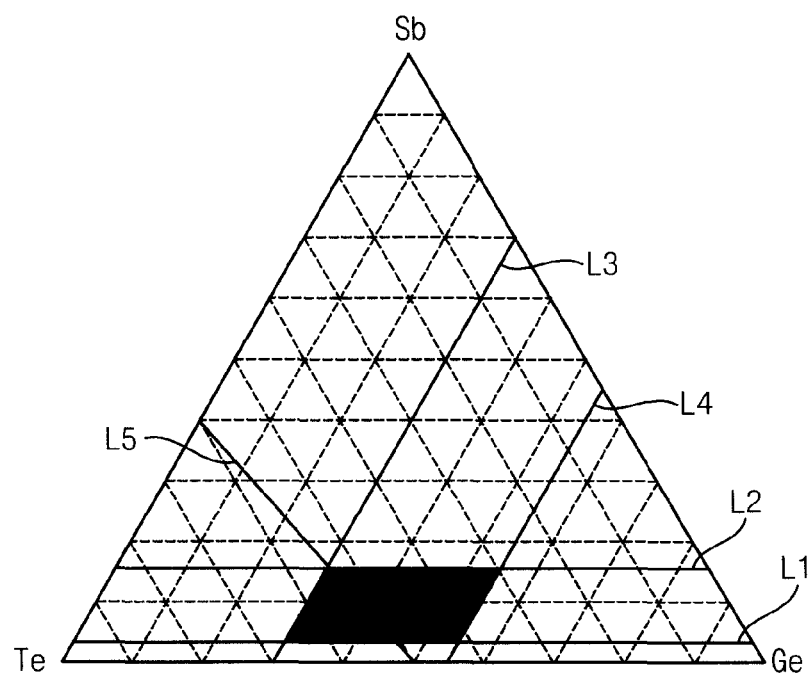

FIG. 7B is Ge—Sb—Te ternary phase diagrams showing compositions of GST materials. The phase change material layer in accordance with at least one example embodiment may be defined with reference to FIG. 7B.

The phase change material layer may include a chalcogenide compound (e.g., GeSbTe (GST)) doped with at least one of impurities (X). That is, the at least one of impurities (X) selected from group III, group IV, group V and group VI may be doped into the Ge—Sb—Te system.

The composition of the GST may be defined with reference to composition lines of FIG. 7B. For example, the first composition line L1 is defined as the atomic concentration of antimony (Sb) of about 0.03, and the second composition line L2 is defined as the atomic concentration of antimony (Sb) of about 0.15. The third composition line L3 is defined as the atomic concentration of germanium (Ge) of about 0.3, and the fourth composition line L4 is defined as the atomic concentration of germanium (Ge) of about 0.55. The composition of the GST may be in the area surrounded by the composition lines L1 to L4. Further, the phase change material layer may include the GST doped with the impurity (X).

In at least one example embodiment, the impurities (X) may be selected from boron (B), carbon (C), nitrogen (N), oxygen (O), aluminum (Al), silicon (Si), phosphorus (P) and sulfur (S). Further, the atomic concentration of the impurities may be between 0 and about 0.25.

In an example embodiment, the phase change material layer may be overlapped with a fifth composition line L5 which may be a tie line between GeTe and $Sb_2Te_3$. That is, the area surrounded by the first to fourth composition lines L1 to L4 are partially overlapped with the fifth line L5. The GST disposed in the area surrounded by the first to fourth composition lines L1 to L4 and on the fifth line L4 may be chemically stable than other GST.

Method of Manufacturing the Phase Change Material Layer

According to at least one example embodiment, the phase change material layer may be formed by a sputtering process, a chemical vapor deposition (CVD) process, a cyclic CVD process or an atomic layer deposition (ALD) process. Particularly, when the phase change material layer is formed by the ALD process, a desired composition of the phase change material layer may be formed by adjusting the source gas supply time and the source gas supply cycle. Further, the ALD process may have a desired step coverage, so that the phase change material layer may be formed in a hole having a width below about 20 nm.

Figure 10A:
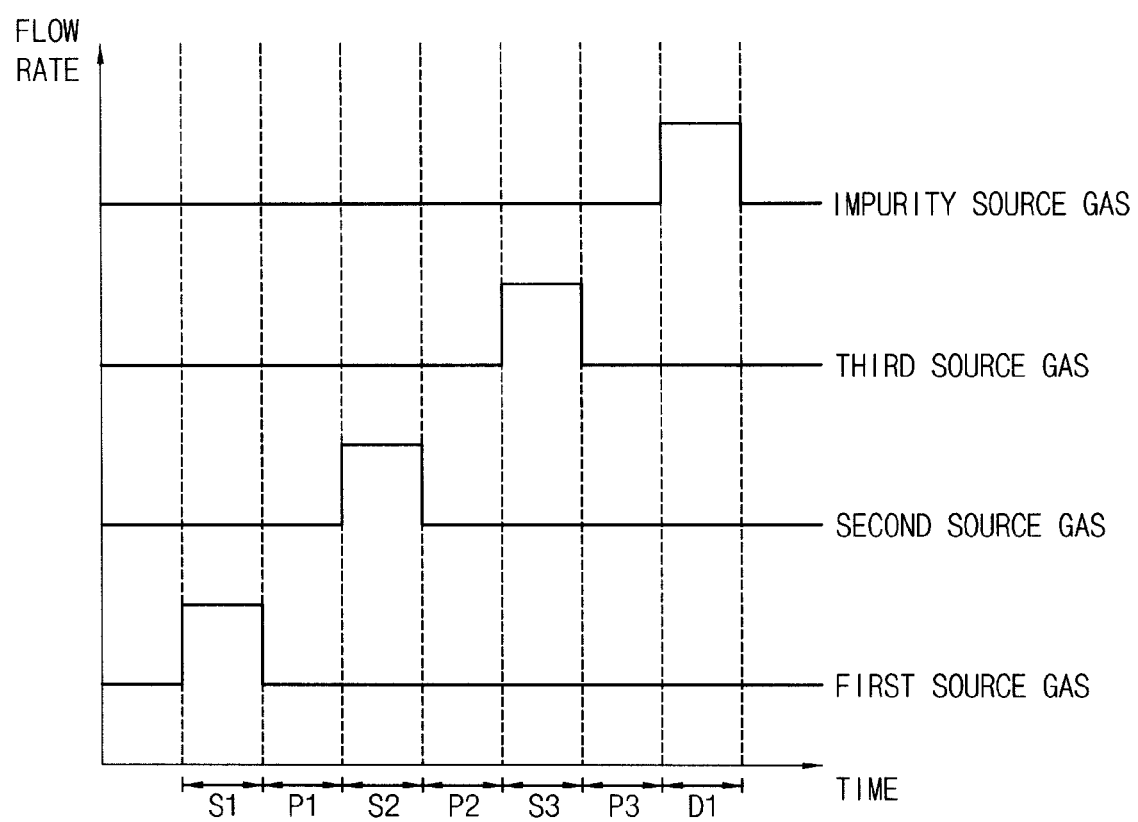

FIGS. 10A and 10B are diagrams illustrating a method of manufacturing a phase change material layer in accordance with at least one example embodiment. In FIGS. 10A and 10B, the "X" axis represents a source gas supply time, and the "Y" axis represents a supply quantity of the source gas.

In at least one example embodiment, the phase change material layer may be formed by performing the ALD process in which a step for supplying a source gas into a process chamber and a step for purging the process chamber are performed alternately and repeatedly.

As illustrated in FIG. 10A, the steps for supplying the source gases S1, S2 and S2 may include supply at least one source gases selected from a Ge source gas, a Sb source gas and a Te source gas into the process chamber. In at least one example embodiment, a reactant gas may be supply with the source gases, and the source gas may react with the reactant gas, thereby forming Ge, Sb or Te material layer. In at least one example embodiment, a step for supplying the reactant gas may be performed separately. That is, the step for supplying the source gas and the step for supplying the reactant gas may not be overlapped. Alternatively, the source gases may be reacted with plasma generated in the process chamber.

Further, a step for purging the process chamber P1, P2, P3 and P4 are performed between the steps for supplying the source gases S1, S2 and S3. In the purging step, the source gas remained in the process chamber may be removed.

On the other hand, a step for supplying an impurity source gas D1 may be further performed to dope impurities into the phase change material layer. The impurity source gas may include a gas having boron (B), carbon (C), nitrogen (N), oxygen (O), aluminum (Al), silicon (Si), phosphorus (P) or sulfur (S). During the step for supplying the impurity source gas D1, plasma may be generated in the process chamber, such that the reaction of the impurity source gas may be activated. In an example embodiment, the step for supplying the impurity source gas may be performed separately or may be performed together with the step for supplying the source gases.

According to at least one example embodiment, the step for supplying the Ge source gas, the step for supplying the Sb source gas and the step for supplying the Te source gas may be performed sequentially, however sequence of the steps may be adjusted.

Referring to FIG. 10B, a first cycle for forming the $Ge_xTe_{(1-x)}$ may include the step for supplying the Ge source gas, the step for supplying the Te source gas and the steps for purging the process chamber. Further, a second cycle for forming $Sb_yTe_{(1-y)}$ may include the step for supplying the Te source gas, the step for supplying the Sb source gas and the steps for purging the process chamber.

In an example embodiment, the first cycle may be performed to form GeTe material layer, and the second cycle may be performed to form $Sb_2Te_3$ material layer. The phase change material layer in accordance with at least one example embodiment may include relatively small atomic concentration of antimony (Sb), so that the second cycle may be performed once, while the first cycle may be performed several times.

Further, the steps for supplying impurity gases D1 and D2 may be performed after the first cycle and/or the second cycle, so that the impurities may be doped into the GST layer.

In at least one example embodiment, a pressure in the process chamber may be maintained constant during the steps for supplying the source gases and the steps for purging the process chamber. In at least one example embodiment, a pressure in the process chamber during the steps for supplying the source gases may be higher than the pressure during the steps for purging the process chamber, such that the lower temperature deposition characteristic of the ALD process and the composition uniformity of the phase change material layer may be improved.

For example, the Ge source gas may include $Ge(CH_3)_4$, $Ge(C_2H_5)_4$, $Ge(n-C_4H_9)_4$, $Ge(i-C_4H_9)_4$, $Ge(C_6H_5)_4$, $Ge(CH_2=CH)_4$, $Ge(CH_2CH=CH_2)_4$, $Ge(CF_2=CF)_4$, $Ge(C_6H_5CH_2CH_2CH_2)_4$, $Ge(CH_3)_3(C_6H_5)$, $Ge(CH_3)_3(C_6H_5CH_2)$, $Ge(CH_3)_2(C_2H_5)_2$, $Ge(CH_3)_2(C_6H_5)_2$, $GeCH_3(C_2H_5)_3$, $Ge(CH_3)_3(CH=CH_2)$, $Ge(CH_3)_3(CH_2CH=CH_2)$, $Ge(C_2H_5)_3(CH_2CH=CH_2)$, $Ge(C_2H_5)_3(C_5H_5)$, $Ge(CH_3)_3H$, $Ge(C_2H_5)_3H$, $Ge(i-C_3H_7)_3H$, $Ge(C_3H_7)_3H$, $Ge(C_4H_9)_3H$, $Ge(t-C_4H_9)H_3$, $Ge(N(CH_3)_2)_4$, $Ge(N(CH_3)(C_2H_5))_4$, $Ge(N(C_2H_5)_2)_4$, $Ge(N(i-C_3H_7)_2)_4$, or $Ge(N(Si(CH_3)_3)_2)_4$.

The Te source gas may include $Te(CH_3)_2$, $Te(CH(CH_3)_2)$, $Te(C_2H_5)_2$, $Te(n-C_3H_7)_2$, $Te(i-C_3H_7)_2$, $Te(C_4H_9)$, $Te(t-C_4H_9)_2$, $Te(i-C_4H_9)_2$, $Te(CH_2=CH)_2$, $Te(CH_2CH=CH_2)_2$ or $Te(N(Si(CH_3)_3)_2)_2$.

Further, the Sb source gas may include $Sb(CH_3)_3$, $Sb(C_2H_5)_3$, $Sb(C_3H_7)_3$, $Sb(i-C_3H_7)_3$, $Sb(n-C_3H_7)_3$, $Sb(i-C_4H_9)_3$, $Sb(t-C_4H_9)_3$, $Sb(N(CH_3)_2)_3$, $Sb(N(CH_3)(C_2H_5))_3$, $Sb(N(C_2H_5)_2)_3$, $Sb(N(i-C_3H_7)_2)_3$ or $Sb(N(Si(CH_3)_3)_2)_3$.

Method of Manufacturing a Phase Change Memory Device

FIGS. 11 to 34 are cross-sectional views illustrating a method of manufacturing a phase-change memory device in accordance with at least one example embodiment. Particularly, FIGS. 11, 13, 15, 17, 19, 21, 23, 25, 27, 29, 31 and 33 are cross-sectional views of the semiconductor device cut along a first direction, and FIGS. 12, 14, 16, 18, 20, 22, 24, 26, 28, 30 and 32 are cross-sectional views of the semiconductor device cut along a second direction substantially perpendicular to the first direction.

Figure 11:
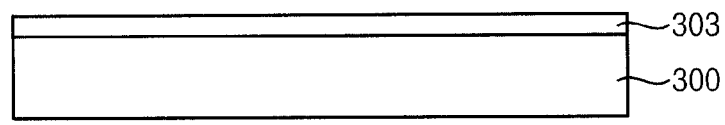
Figure 12:
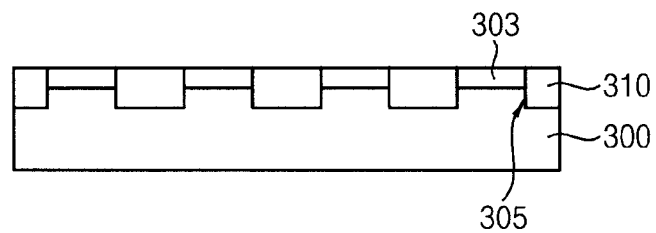

Referring to FIGS. 11 and 12, after an impurity region may be formed by an ion implantation process onto an upper portion of a substrate 300, an isolation layer pattern 310 may be formed at an upper portion of the substrate 300 to divide the substrate 300 into an active region and a field region, and word lines 303 may be formed.

According to at least one example embodiment, the impurity region may be formed by implanting first impurities, e.g., n-type impurities such as phosphorus, arsenic, etc., or p-type impurities such as boron, gallium, etc., into the upper portion of the substrate 300. In an example embodiment, the first impurities may be n-type impurities. Before forming the impurity region, a well region (not illustrated) doped with impurities of conduction type different from that of the first impurities may be formed in the substrate 300.

In at least one example embodiment, the isolation layer pattern 310 may be formed by a shallow trench isolation (STI) process. That is, after trenches 305 may be formed on the substrate 300, an isolation layer may be formed on the substrate 300 to sufficiently fill the trenches 305, and an upper portion of the isolation layer may be planarized until a top surface of the substrate 300 may be exposed to form the isolation layer pattern 310. According to at least one example embodiment, the isolation layer may be formed using a silicon oxide, e.g., boro-phospho silicate glass (BPSG), phospho-silicate glass (PSG), undoped silicate glass (USG), flowable oxide (FOX), tetra-ethyl ortho-silicate (TEOS), plasma enhanced tetra-ethyl ortho-silicate (PE-TEOS), high density plasma chemical vapor deposition (HDP-CVD) oxide, etc. In at least one example embodiment, the planarization process may be performed by a chemical mechanical polishing (CMP) process and/or an etch back process. In at least one example embodiment, the isolation layer pattern 310 may be formed to extend in a first direction parallel to the top surface of the substrate 300, and a plurality of isolation layer patterns 310 may be formed in a second direction substantially perpendicular to the first direction. Accordingly, the active region of the substrate 300 may be also formed to extend in the first direction, and a plurality of active regions may be formed in the second direction.

In at least one example embodiment, the isolation layer patterns 310 may be formed to have a bottom surface lower than a surface of the impurity region, and thus the impurity region formed at an upper portion of the active region may be divided into a plurality of word lines 303 by the isolation layer patterns 310. In at least one example embodiment, each word line 303 may extend in the first direction, and a plurality of word lines 303 may be formed in the second direction.

Figure 13:
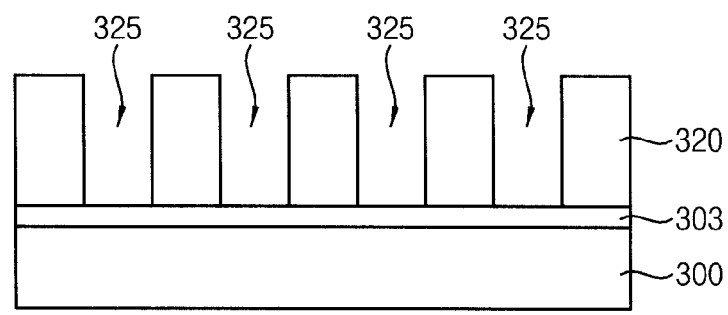
Figure 14:
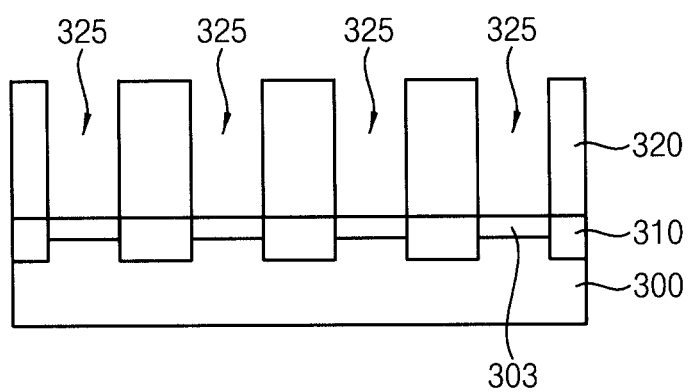

Referring to FIGS. 13 and 14, a first insulating interlayer 320 having a plurality of first contact holes 325 therethrough, which may be arranged in both of the first and second directions at regular distances, may be formed on the substrate 300 and the isolation layer patterns 310. The first contact holes 325 may form a first contact hole array.

The first contact holes 325 may be formed by forming the first insulating interlayer 320 on the substrate 300, and etching the first insulating interlayer 320 anisotropically to expose top surfaces of the word lines 303 of the substrate 300.

The first insulating interlayer 320 may be formed to include an insulating material such as an oxide, a nitride, etc.

Figure 15:
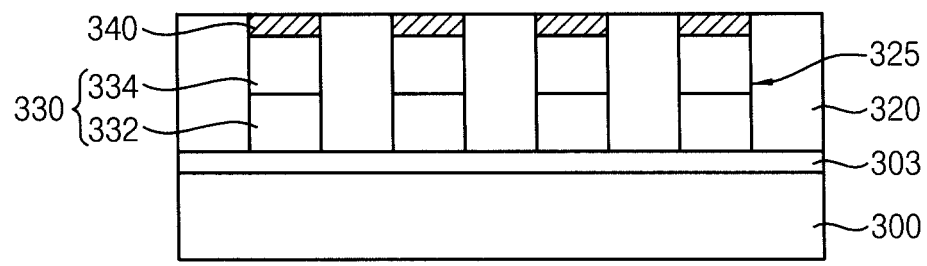
Figure 16:
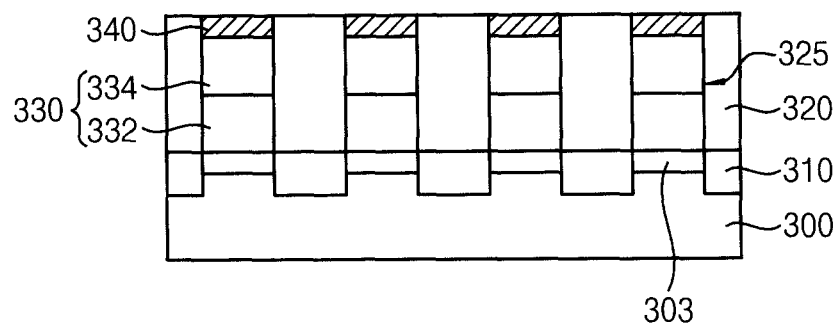

Referring to FIGS. 15 and 16, a diode 330 and an ohmic pattern 340 may be formed sequentially to fill each first contact hole 325.

In at least one example embodiment, a selective epitaxial growth (SEG) process may be performed using the exposed top surfaces of the word lines 303 as a seed layer to form a silicon layer filling the first contact holes 325, and second and third impurities may be implanted into lower and upper portions of the silicon layer, respectively, to form the diode 330. Accordingly, the lower and the upper portions of the silicon layer may be defined as a lower diode layer 332 and an upper diode layer 334, respectively, and the lower diode layer 332 may contact the top surfaces of the word lines 303. Before implanting the second and third impurities thereinto, a planarization process may be further performed on a top surface of the silicon layer, so that a top surface of the diode 330 may have a height substantially the same as that of the first insulating interlayer 320.

In an example embodiment, the second impurities may include n-type impurities, e.g., phosphorous, arsenic, etc., and the third impurities may include p-type impurities, e.g., boron, gallium, etc.

In at least one example embodiment, a metal layer (not illustrated) may be formed on the diode 330 and the first insulating interlayer 320, and the metal layer and silicon of the diode 330 may be reacted with each other by a heat treatment process to form the ohmic pattern 340, which may reduce a contact resistance between the diode 330 and a contact plug 360 (refer to FIGS. 19 and 20) subsequently formed. In at least one example embodiment, the metal layer may be formed to include a metal such as cobalt, nickel, tungsten, etc., and thus the ohmic pattern 340 may be formed to include a metal silicide such as cobalt silicide, nickel silicide, tungsten silicide, etc. A portion of the metal layer that has not been reacted may be removed.

Alternatively, the ohmic pattern 340 may be formed by directly implanting metal ions into an upper portion of the diode 330. In some embodiments, the process for forming the ohmic pattern 340 may be skipped.

According to at least one example embodiment, the diode 330 and the ohmic pattern 340 may be formed in each first contact hole 325, and thus a plurality of diodes 330 and a plurality of ohmic patterns 340 may be formed to form a diode array and an ohmic pattern array, respectively.

Figure 17:
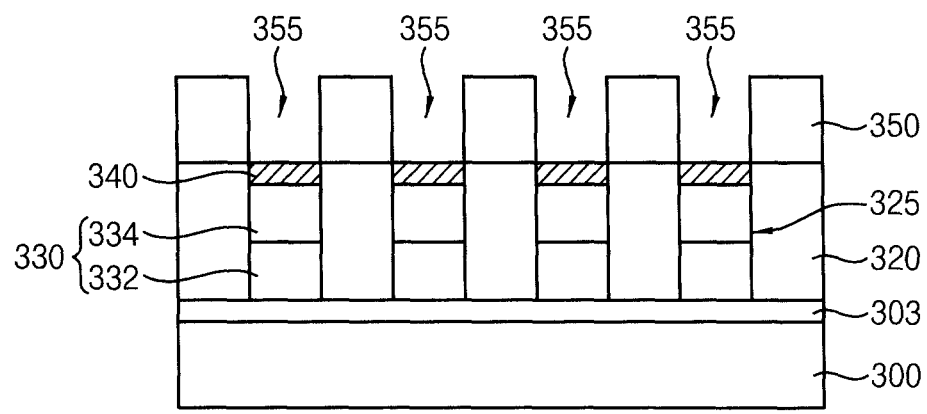
Figure 18:
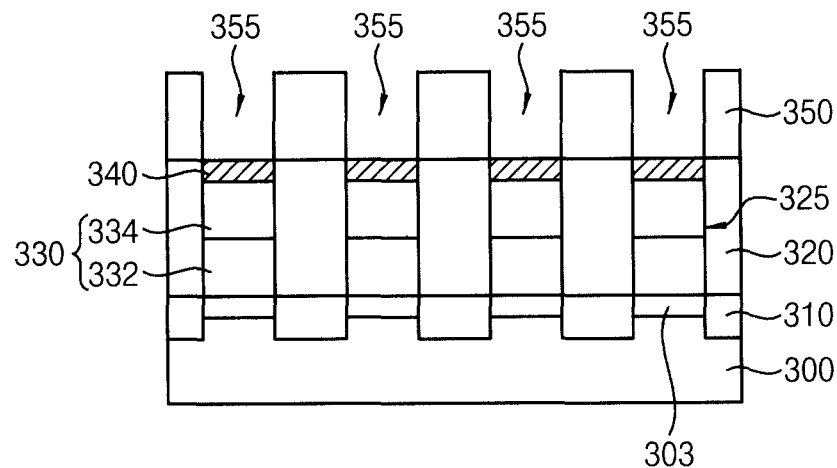

Referring to FIGS. 17 and 18, processes substantially the same as or similar to those illustrated with reference to FIGS. 13 and 14 may be performed, so that a second insulating interlayer 350 having a plurality of second contact holes 355 therethrough, which may be arranged in the first and second directions at regular distances, may be formed on the first insulating interlayer 320 and the ohmic patterns 340.

That is, the second contact holes 355 may be formed by forming the second insulating interlayer 350 on the first insulating interlayer 320 and the ohmic patterns 340 using an insulating material such as an oxide, a nitride, etc., and etching the second insulating interlayer 350 anisotropically to expose top surfaces of the ohmic patterns 340. The second contact holes 355 may form a second contact hole array.

Figure 19:
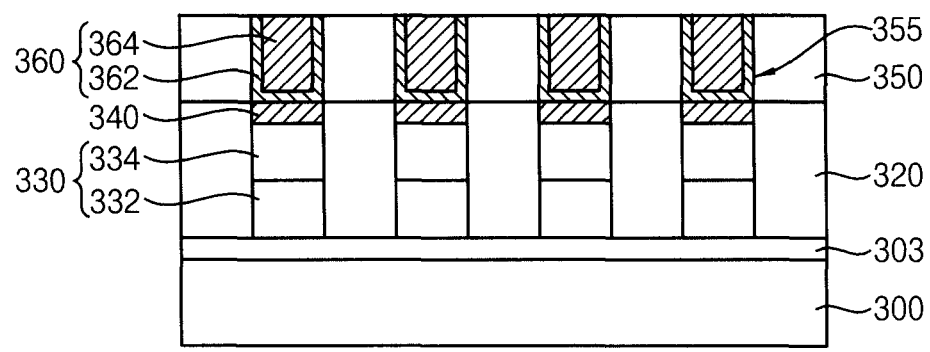
Figure 20:
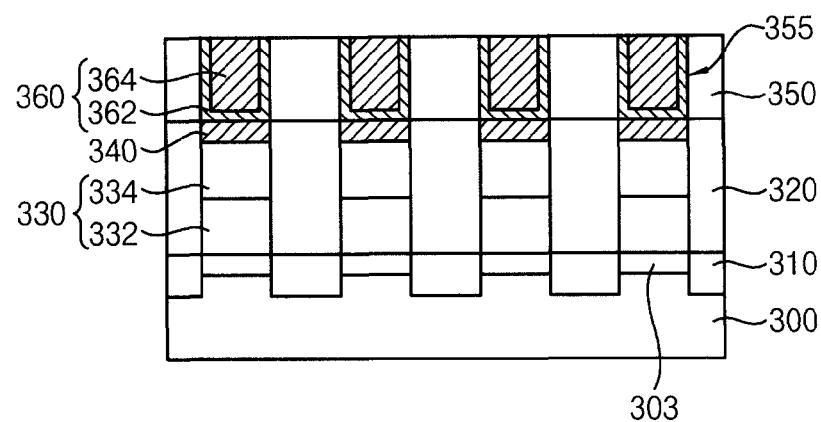

Referring to FIGS. 19 and 20, a contact plug 360 may be formed to fill each second contact hole 355. Thus, a plurality of contact plugs 360 may be formed both in the first and second directions to form a contact plug array.

In at least one example embodiment, the contact plug 360 may be formed by forming a first barrier layer on the exposed top surfaces of the ohmic patterns 340, sidewalls of the second contact holes 355 and a top surface of the second insulating interlayer 350, by forming a first conductive layer on the first barrier layer to sufficiently fill remaining portions of the second contact holes 355, and by planarizing upper portions of the first barrier layer and the first conductive layer until a top surface of the second insulating interlayer 350 may be exposed. Thus, the contact plug 360 may be formed to include a first barrier layer pattern 362 and a first conductive layer pattern 364, and the first barrier layer pattern 362 may surround a sidewall and a bottom of the first conductive layer pattern 364.

According to at least one example embodiment, the first barrier layer may be formed to include a metal or a metal nitride, e.g., titanium, titanium nitride, etc., and the first conductive layer may be formed to include a low resistance metal, e.g., copper, tungsten, aluminum, etc.

Alternatively, in an example embodiment, the contact plug 360 may not be formed but the process for forming the contact plug 360 may be skipped.

Figure 21:
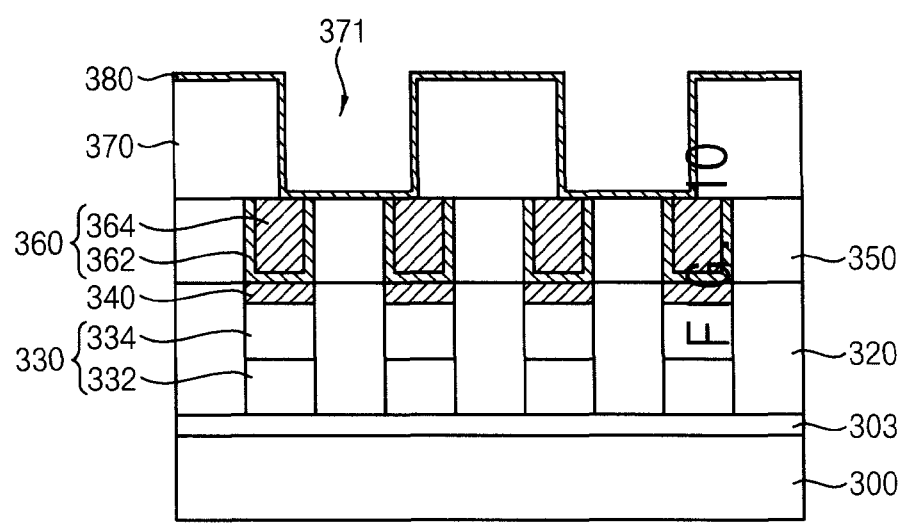
Figure 22:
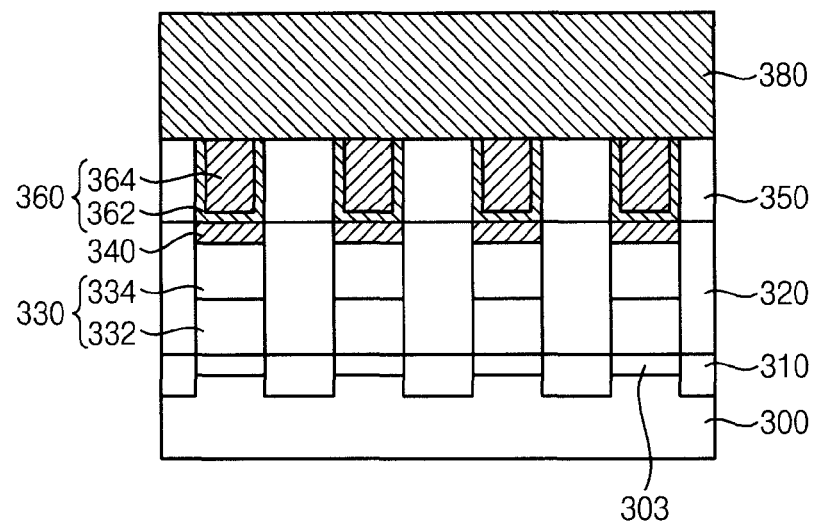

Referring to FIGS. 21 and 22, a third insulating interlayer 370 having a first opening 371 partially exposing a top surface of the contact plug 360 may be formed on the second insulating interlayer 350, and a lower electrode layer 380 may be formed on a sidewall of the first opening 371, the exposed top surface of the contact plug 360, the second insulating interlayer 350 and the third insulating interlayer 370.

In at least one example embodiment, a plurality of first openings 371 may be formed in the first direction, and each first opening 371 may be formed to extend in the second direction. Two contact plugs 360 adjacent to each other in the first direction may be exposed by the same first opening 371.

The lower electrode layer 380 may be formed to include a metal compound such as a metal, a metal nitride or a metal silicon nitride, and may be conformally formed on the exposed top surfaces of the contact plugs 360 and the second insulating interlayer 350, the sidewalls of the first openings 371 and the top surface of the third insulating interlayer 370.

The third insulating interlayer 370 may be formed to include an insulating material such as an oxide, a nitride, etc.

Figure 23:
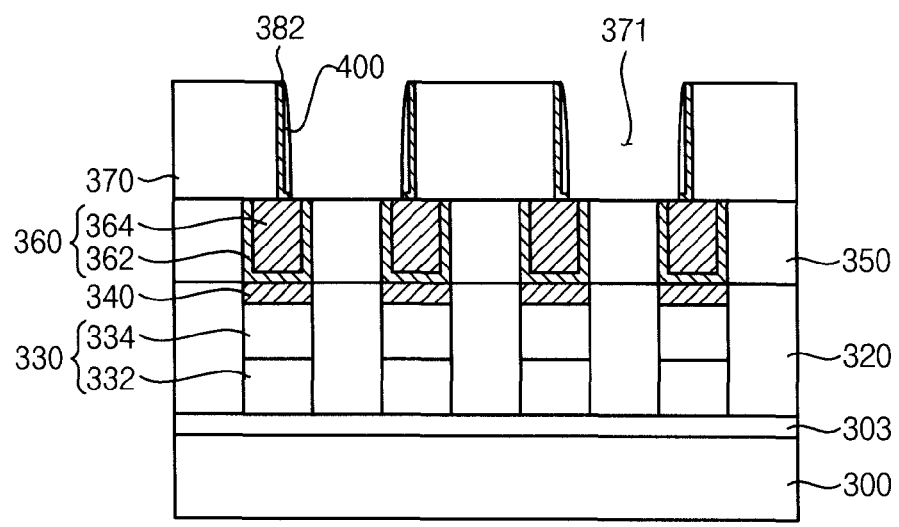
Figure 24:
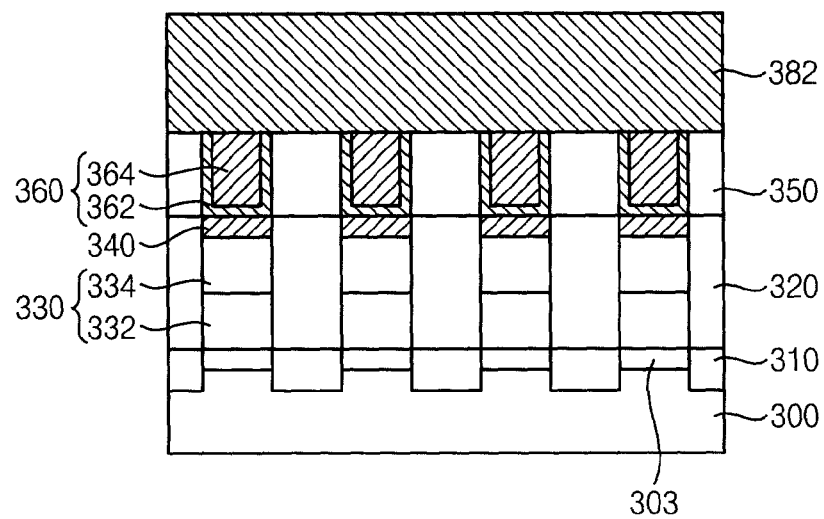

Referring to FIGS. 23 and 24, a spacer 400 may be formed on the lower electrode layer 380, and the lower electrode layer 380 may be etched using the spacer 400 as an etching mask to form a lower electrode layer pattern 382.

The spacer 400 may be formed by forming a spacer layer on the lower electrode layer 380, and etching the spacer layer anisotropically. Thus, two spacers 400 may be formed in the first opening 371. According as the plurality of first openings 371 may be formed in the first direction, a plurality of spacers 400 may be also formed in the first direction.

Accordingly, the lower electrode layer pattern 382 may be formed to extend in the second direction on the sidewall of the first opening 371, and a plurality of first electrode layer patterns 382 may be formed in the first direction. The lower electrode layer 380 may be conformally formed on the sidewall of the first opening 371 and the exposed top surface of the contact plug 360, and thus each lower electrode layer pattern 382 may have a cross-section cut along the first direction of which a shape may be an "L" shape or a "J-like" shape. According as the lower electrode layer pattern 382 may have the cross-section of an "L" shape, a contact area between the lower electrode layer pattern 382 and the contact plug 360 may be larger than a contact area between the lower electrode layer pattern 382 and the phase change materials layer pattern 470 (refer to FIGS. 31 and 32) subsequently formed, so that the phase change material layer pattern 470 may be efficiently heated even with a small current.

The spacer layer may be formed to include an insulating material such as an oxide, a nitride, etc., and may be formed to include a material substantially the same as that of the third insulating interlayer 370.

Figure 25:
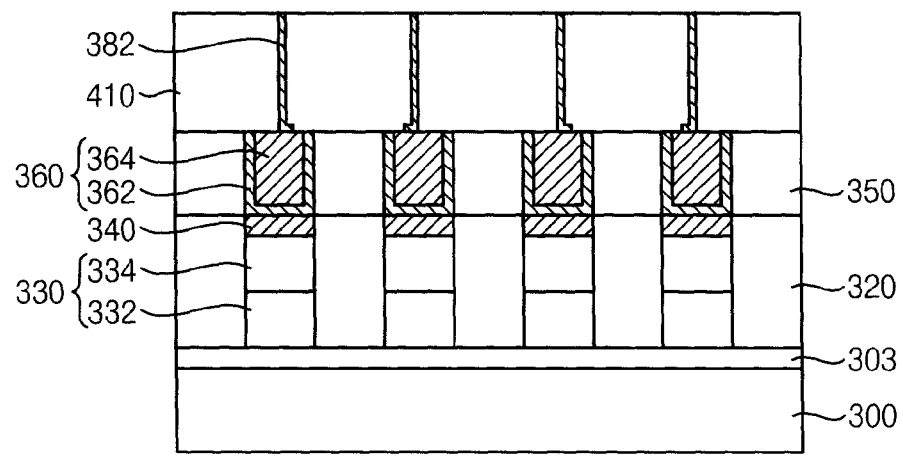
Figure 26:
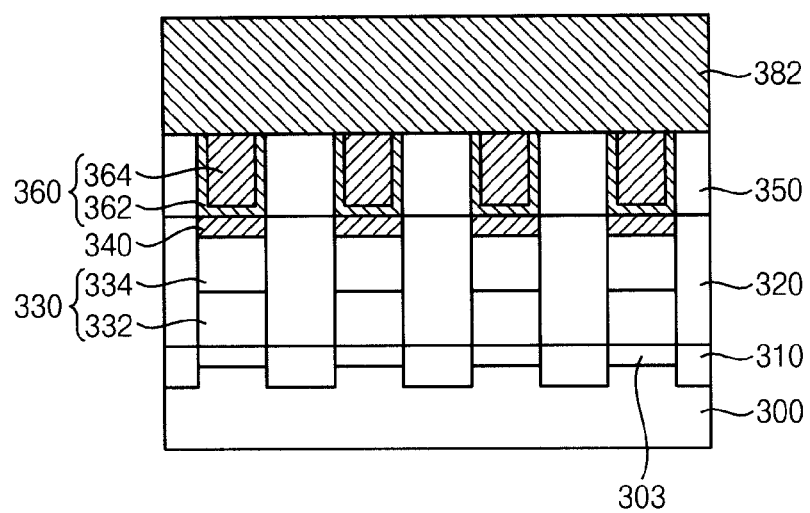

Referring to FIGS. 25 and 26, a fourth insulating interlayer (not illustrated) sufficiently filling remaining portions of the first opening 371 may be formed on the exposed top surfaces of the contact plugs 360 and the second insulating interlayer 350, the spacers 400, the lower electrode layer patterns 382 and a top surface of the third insulating interlayer 370, and may be planarized until a top surface of the lower electrode layer patterns 382 may be exposed.

According to at least one example embodiment, the fourth insulating interlayer may be formed to include an insulating material such as an oxide, a nitride, etc., and may be formed to include a material substantially the same as that of the third insulating interlayer 370 and the spacer 402. Thus, the fourth insulating interlayer, the spacer 400 and the third insulating interlayer 370 may be merged, and hereinafter, the merged layer may be referred to simply as a fourth insulating interlayer 410. That is, the fourth insulating interlayer 410 may surround sidewalls of the lower electrode layer patterns 382, and may be formed on the contact plugs 360 and the second insulating interlayer 350.

Figure 27:
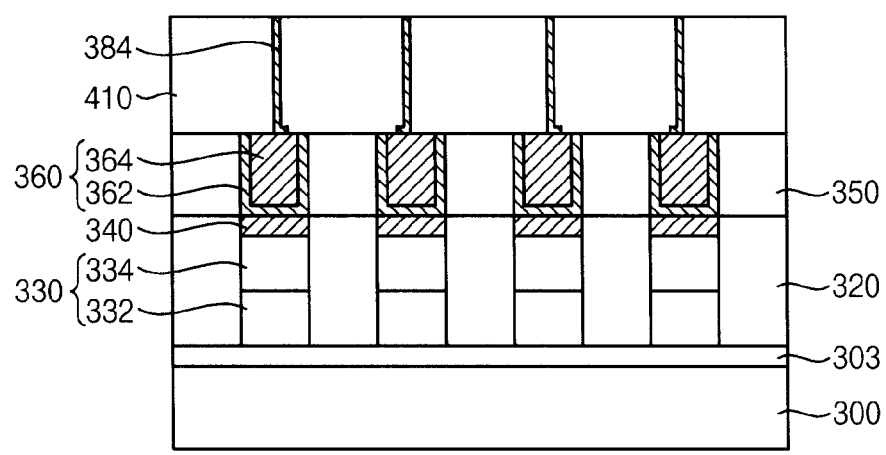
Figure 28:
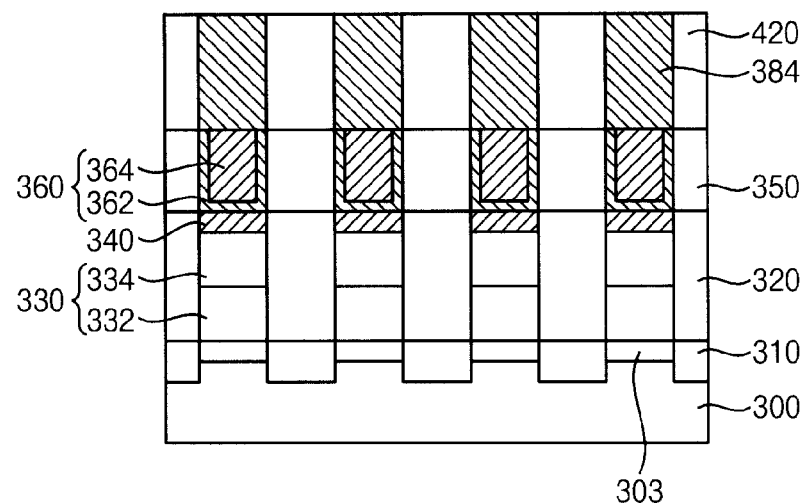

Referring FIGS. 27 and 28, the lower electrode pattern 382 may be partially etched by an etching process using a photoresist pattern (not illustrated) extending in the first direction to form a plurality of lower electrodes 384 in the second direction. The plurality of lower electrode patterns 382 may be formed in the first direction, and thus the plurality of lower electrodes 384 may be also formed in the first direction. Accordingly, a lower electrode array including the plurality of lower electrodes 384, which may be formed both in the first and second directions, may be formed.

When the lower electrode pattern 382 is etched, the fourth insulating interlayer 410 may be also partially etched to form a second opening (not illustrated), and a fifth insulating interlayer 420 may be formed to fill the second opening.

Figure 29:
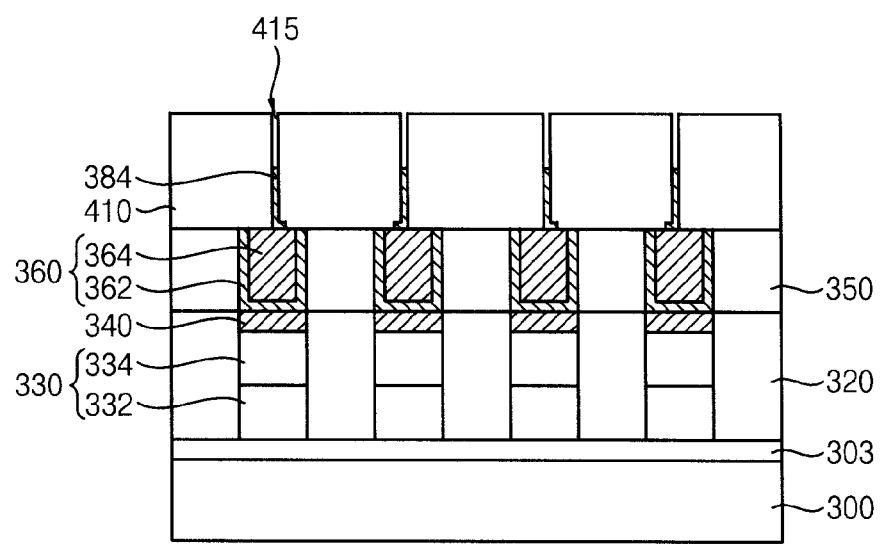
Figure 30:
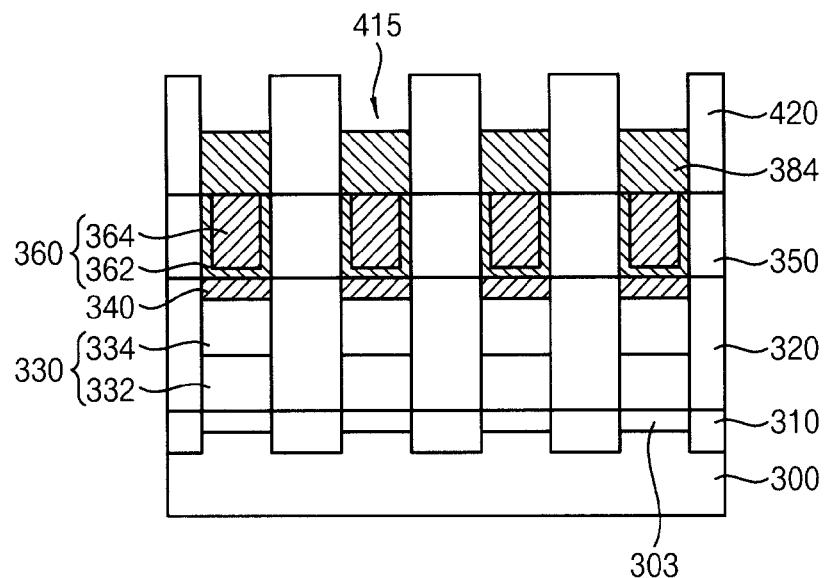

Referring to FIGS. 29 and 30, an upper portion of each lower electrode 384 may be removed to form a recess 415.

In at least one example embodiment, the lower electrodes 384 may be partially removed by, e.g., a wet etching process. The plurality of lower electrodes 184 may be formed both in the first and second directions to form the lower electrode array, and thus a plurality of recesses 415 may be formed both in the first and second directions to form a recess array.

Figure 31:
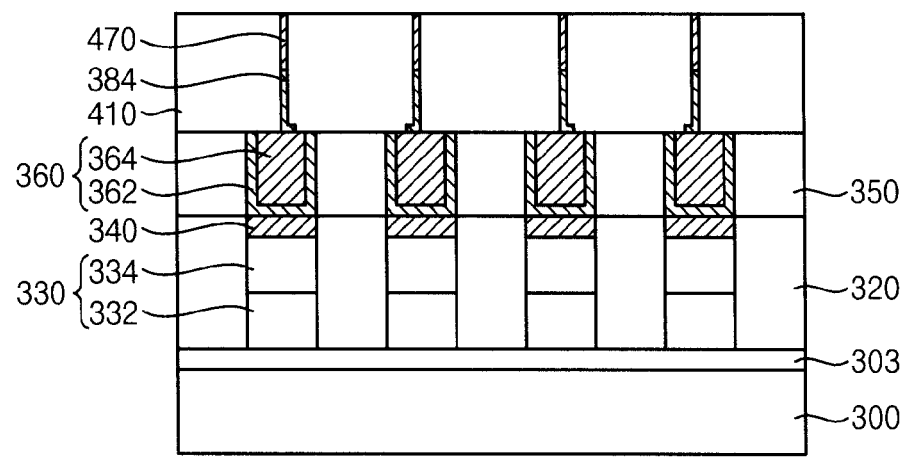
Figure 32:
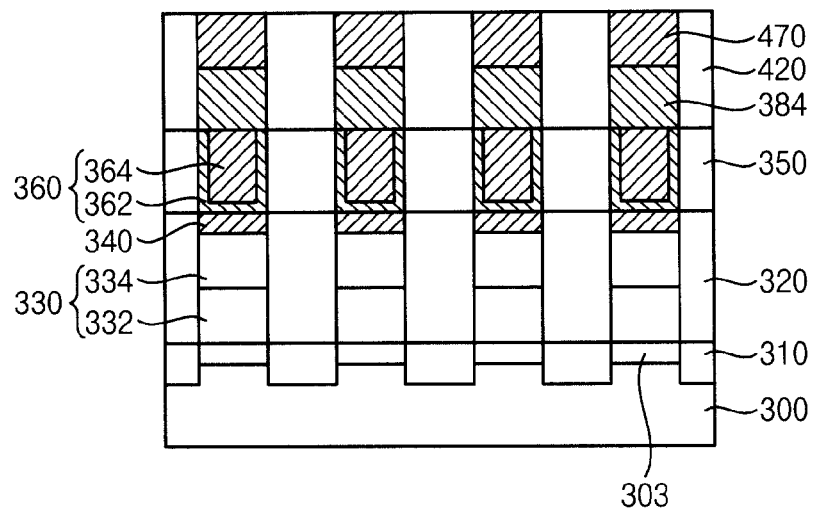

Referring to FIGS. 31 and 32, processes substantially the same as or similar to those illustrated with reference to FIGS. 10*a* and 10*b* may be performed, so that the phase change material layer pattern 470 may be formed to fill each recess 415.

According to at least one example embodiment, the phase change material layer may be formed by a sputtering process, a chemical vapor deposition (CVD) process, a cyclic CVD process or an atomic layer deposition (ALD) process. Particularly, when the phase change material layer is formed by the ALD process, desired composition of the phase change material layer may be formed by adjusting the source gas supply time and the source gas supply cycle.

In at least one example embodiment, a first cycle for forming GeTe may include a step for supplying a Ge source gas, a step for supplying a Te source gas and a purge step disposed therebetween, and a second cycle for forming $Sb_2Te_3$ may include a step for supplying a Ge source gas, a step for supplying a Sb source gas and a purge step disposed therebetween. The phase change material layer in accordance with at least one example embodiment may include a relatively small atomic concentration of antimony (Sb), so that the second cycle may be performed once, while the first cycle may be performed several times. Further, a step for supplying impurity gas may be performed after the first cycle and/or the second cycle, so that the impurities may be doped into the GST layer.

Figure 33:
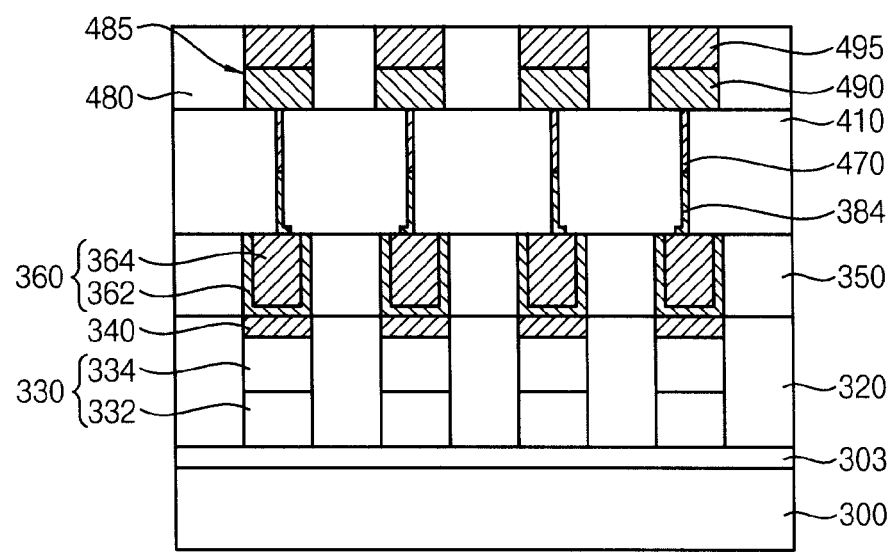
Figure 34:
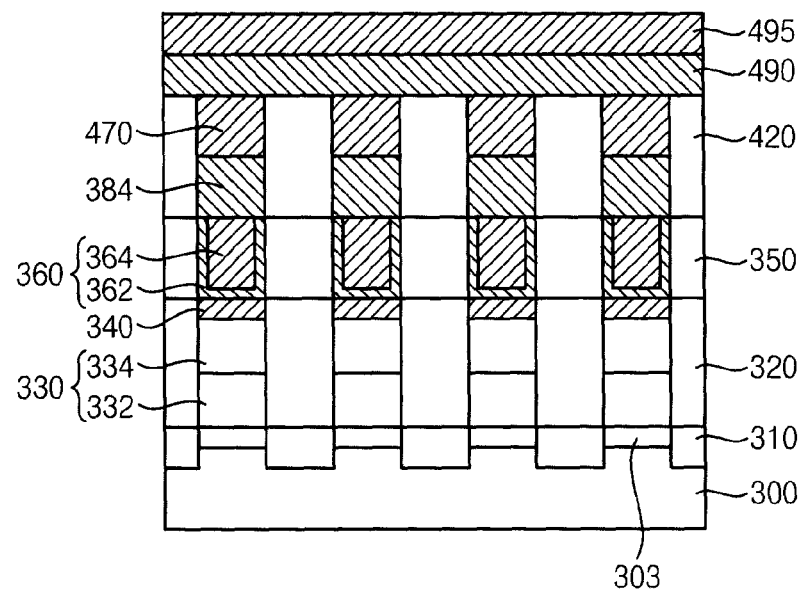

Referring to FIGS. 33 to 34, a sixth insulating interlayer 480 having a plurality of third openings 485 each of which may expose a top surface of the phase change material layer pattern 470 may be formed on the fourth and fifth insulating interlayer patterns 410 and 420, and an upper electrode 490 and a bit line 500 filling each third opening 485 may be sequentially formed.

According to at least one example embodiment, the upper electrode 490 may be formed by following steps. That is, after a second conductive layer may be formed on the exposed top surfaces of the phase change material layer patterns 470 and top surfaces of the fourth to sixth insulating interlayer patterns 410, 420 and 480 to sufficiently fill the third openings 485, the second conductive layer may be planarized until the top surface of the sixth insulating interlayer 480 may be exposed, and upper portions of the planarized second conductive layer may be removed by, e.g., a wet etching process to form the upper electrode 490. Accordingly, the upper electrode 490 may be formed to cover the top surface of each phase change material layer pattern 470.

A third conductive layer may be formed on top surfaces of the upper electrodes 490 and the sixth insulating interlayer 480 to sufficiently fill spaces from which the upper portions of the second conductive layer are removed, and the third conductive layer may be planarized until the top surface of the sixth insulating interlayer 480 may be exposed to form the bit line 500.

In at least one example embodiment, the plurality of third openings 485 may be formed in the first direction, and thus a plurality of upper electrodes 490 may be also formed in the first direction to form an upper electrode column. As a result, a plurality of bit lines 500 may be also formed in the first direction.

In at least one example embodiment, the sixth insulating interlayer 480 may be formed to include an insulating material such as an oxide, a nitride, etc., the second conductive layer may be formed to include, e.g., a metal, a metal nitride, a metal silicide, etc., and the third conductive layer may be formed to include a low resistance metal, e.g., copper, aluminum, tungsten, etc.

In an example embodiment, the bit line 500 may have a barrier layer pattern (not illustrated) including, e.g., a metal nitride.

Computing System

Figure 35:
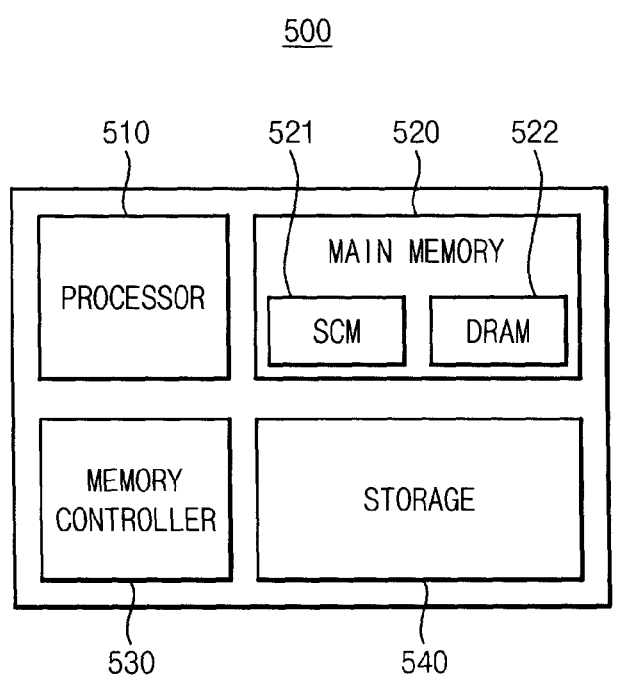

FIG. 35 is a schematic block diagram illustrating an example of computing systems including a phase change memory device according to at least one example embodiment of the present disclosure.

Referring to FIG. 35, the computing system 500 may include a processor 510, a main memory 520, a memory controller 530 and a storage 540.

The main memory 520 may read required files from the storage 540, and may temporarily store the files for the processor 510. That is, the main memory 520 may store data, while the processor 510 is performing the calculation.

The operation speed of the processor 510 is about 1 ns, while the read/write speed of the storage 540 (which may be generally a hard disk) is about 5 ms. Therefore, an access time gap is occurred between the processor 510 and the storage 504. In order to overcome the access time gap, a cache memory (not shown) is used, however if the size of the data is larger than a size of the cash memory, the time delay due to the access time gap may not be avoided. Further, the storage including a solid state disk (SSD), which may have an operation speed of about 20 us, may not compensate the access time gap.

On the other hand, a volatile memory, e.g., SRAM or DRAM may have a problem, when the power supply is abruptly stopped. Therefore, a non-volatile RAM (NVRAM) is required to store a data reliably.

According to at least one example embodiment, the main memory 502 may include a storage class memory (SCM) 521 and a dynamic random access memory (DRAM) 522 at the same time. The SCM 521 may store the data, which may be required for the calculation of the processor 510. Further, the SCM 521 and the DRAM 522 may be controlled by the memory controller 530.

In at least one example embodiment, the SCM 521 may include the NVRAM, and the DRAM 522 may be the volatile memory. Alternatively, the DRAM 522 may be replaced by other kind of the volatile memory.

According to at least one example embodiment, the SCM 521 may include the phase change memory device having a phase change material layer having an improved thermal stability and an improved crystallization rate. That is, a 10 years guaranteed operating temperature of the phase change material layer is above about 70° C., and the phase change material layer has a crystallization time at a temperature above the crystallization temperature which is smaller than 100 ns. Therefore, the SCM 521 including the phase change memory device may have an access time below about 1 um, and may have a single cell random access time below about 100 ns. Therefore, the SCM 521 may compensate the access time gap between the processor 510 and the storage 540.

The computing system 500 may be used as a server which may require a high operation speed and reliability. As the SCM 521 may compensate the access time gap, the operation speed of the computing system 500 may not be limited by the access time gap. Further, the SCM 521 may store the data, in case that the power supply is abruptly stopped. Therefore, the computing system 500 may have an improved reliability due to the reliability of the SCM 521. Further, the computing system 500 may less require a reflexing process of the DRAM 522 due to the non-volatile characteristic of the SCM 521.

The foregoing is illustrative of at least one example embodiment and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A phase change material layer, comprising:
    germanium (Ge), antimony (Sb), tellurium (Te) and at least one impurity element,
    wherein an atomic concentration of the at least one impurity element ranges from about $0<a \leq$ about 0.25,
    an atomic concentration of antimony (Sb) ranges from about $0.03<c \leq$ about 0.15; and
    a crystallization rate of the phase change material within a crystallization temperature range of the phase change material is larger than crystallization rates of GeTe and $Ge_2Sb_2Te_5$.

2. The phase change material layer of claim 1, wherein the atomic concentration of antimony (Sb) ranges from about $0.07 \leq c \leq$ about 0.09.

3. The phase change material layer of claim 1, wherein an atomic concentration of germanium (Ge) ranges from about $0.3 \leq b <$ about 0.55.

4. The phase change material layer of claim 3, wherein the atomic concentration of the at least one impurity element ranges from about $0<a \leq$ about 0.2, and
    the atomic concentration of germanium (Ge) ranges from about $0.35 \leq b <$ about 0.47.

5. The phase change material layer of claim 1, wherein the at least one impurity element includes one of boron (B), carbon (C), nitrogen (N), oxygen (O), aluminum (Al), silicon (Si), phosphorus (P) and sulfur (S).

6. The phase change material layer of claim 3, wherein the at least one impurity element includes bismuth (Bi).

7. The phase change material layer of claim 1, wherein a 10 years operating temperature of the phase change material layer is above about 70° C.

8. The phase change material layer of claim 1, wherein the phase change material layer includes a first impurity element and a second impurity element, the first and second impurity elements, respectively, being boron (B), carbon (C), nitrogen (N), oxygen (O), aluminum (Al), silicon (Si), phosphorus (P) and/or sulfur (S),
    and a sum of amounts of the first and second impurity elements ranges from about $0<a1+a2 \leq$ about 0.2.

9. A phase change material layer, comprising:
    germanium (Ge), antimony (Sb), tellurium (Te) and at least one impurity element,
    wherein a 10 years operating temperature of the phase change material layer is above about 70° C., and
    the phase change material layer has a crystallization rate within a crystallization temperature range of the phase change material that is larger than crystallization rates of GeTe and $Ge_2Sb_2Te_5$.

10. A phase change material layer comprising a quaternary compound,
    wherein the quaternary compound includes GeSbTe doped with at least one of impurity elements,
    and the composition of GeSbTe is located in an area of a phase diagram surrounded by,
    a first composition line having an atomic concentration of antimony (Sb) of about 0.03;
    a second composition line having an atomic concentration of antimony (Sb) of about 0.15;
    a third composition line having an atomic concentration of germanium (Ge) of about 0.3; and
    a fourth composition line having an atomic concentration of germanium (Ge) of about 0.55; and
    wherein a crystallization rate of the phase change material within a crystallization temperature range of the phase change material is larger than crystallization rates of GeTe and $Ge_2Sb_2Te_5$.

11. The phase change material layer of claim 10, wherein the composition of GeSbTe is overlapped with a tie line between GeTe and $Sb_2Te_3$.

12. A phase change device, comprising:
    a first electrode and a second electrode; and
    a phase change material layer coupled to the first and second electrodes, the phase change material layer being configured to undergo a phase transition from one of an amorphous state and a crystalline state to another of the amorphous state and the crystalline state when a voltage is applied between the first electrode and the second electrode;
    a crystallization rate of the phase change material layer within a crystallization temperature range of the phase change material layer being larger than crystallization rates of GeTe and $Ge_2Sb_2Te_5$.

13. The phase change device of claim 12, wherein the phase change material layer comprises a chalcogenide.

14. The phase change device of claim 13, wherein the phase change material layer comprises germanium (Ge), antimony (Sb), tellurium (Te) and at least one impurity element.

15. The phase change device of claim 14, wherein:
    an atomic concentration of the at least one impurity element ranges from 0 to about 0.25, and
    an atomic concentration of antimony (Sb) ranges from about 0.03 to about 0.15.

16. The phase change material device of claim 14, wherein the at least one impurity element comprises at least one of bismuth (Bi), boron (B), carbon (C), nitrogen (N), oxygen (O), aluminum (Al), silicon (Si), phosphorus (P) and sulfur (S); and the atomic concentration of the at least one impurity element ranges from 0 to about 0.2.

17. The phase change material device of claim 14, wherein an atomic concentration of germanium (Ge) ranges from about 0.3 to about 0.55.

18. The phase change device of claim 12, wherein the first electrode is provided on a structure including:
a substrate;
a word line disposed on the substrate;
an isolation layer pattern between portions of the word line and the substrate, wherein the portions of the word line and the substrate that include the isolation layer are field regions, and other portions are active regions;
a switching unit disposed on the word line;
an ohmic pattern disposed on the switching unit; and
a plug disposed on the ohmic pattern, wherein the first electrode is disposed on the plug.

* * * * *